United States Patent
Leitz et al.

(10) Patent No.: US 6,916,727 B2
(45) Date of Patent: Jul. 12, 2005

(54) ENHANCEMENT OF P-TYPE METAL-OXIDE-SEMICONDUCTOR FIELD EFFECT TRANSISTORS

(75) Inventors: Christopher W. Leitz, Nashua, NH (US); Minjoo L. Lee, Cambridge, MA (US); Eugene A. Fitzgerald, Windham, NH (US)

(73) Assignee: Massachusetts Institute of Technology, Cambridge, MA (US)

( * ) Notice: Subject to any disclaimer, the term of this patent is extended or adjusted under 35 U.S.C. 154(b) by 160 days.

(21) Appl. No.: 10/177,571

(22) Filed: Jun. 21, 2002

(65) Prior Publication Data

US 2002/0197803 A1 Dec. 26, 2002

Related U.S. Application Data

(60) Provisional application No. 60/310,396, filed on Aug. 6, 2001, and provisional application No. 60/299,986, filed on Jun. 21, 2001.

(51) Int. Cl.$^7$ .............................................. H01L 21/20
(52) U.S. Cl. ..................................... 438/478; 257/192
(58) Field of Search ........................ 438/478; 257/192

(56) References Cited

U.S. PATENT DOCUMENTS

| | | | |
|---|---|---|---|
| 4,710,788 A | 12/1987 | Dämbkes et al. | |
| 4,920,076 A | 4/1990 | Holland et al. | |
| 4,990,979 A | 2/1991 | Otto | |
| 5,241,197 A | 8/1993 | Murakami et al. | |
| 5,291,439 A | 3/1994 | Kauffmann et al. | |
| 5,312,766 A | 5/1994 | Aronowitz et al. | |
| 5,327,375 A | 7/1994 | Harari | |
| 5,442,205 A | 8/1995 | Brasen et al. | |
| 5,461,243 A | 10/1995 | Ek et al. | |
| 5,523,592 A | 6/1996 | Nakagawa et al. | |

(Continued)

FOREIGN PATENT DOCUMENTS

| | | |
|---|---|---|
| DE | 41 01 167 A1 | 7/1992 |
| EP | 0 683 522 A2 | 11/1995 |
| EP | 0 829 908 A2 | 3/1998 |
| EP | 0 838 858 A2 | 4/1998 |
| EP | 0 844 651 A1 | 5/1998 |
| EP | 1 020 900 A2 | 7/2000 |

(Continued)

OTHER PUBLICATIONS

Eaglesham et al., "Dislocation–Free Stranski–Krastanow Growth of Ge on Si(100)," *Physical Review Letters,* vol. 64, No. 16 (Apr. 16, 1999) pp. 1943–1946.

Fitzgerald et al., "Totally Relaxed $Ge_xSi_{1-x}$ layers with low threading dislocation densities grown on Si substrates," *Applied Physics Letters,* vol. 59, No. 7 (Aug. 12, 1991) pp. 811–813.

Fitzgerald et al., "Related $Ge_xSi_{1-x}$ structures for III–V integration with Si and high mobility two–dimensional electron gases in Si," *J. Vac. Sci. Technol. B,* vol. 10, No. 4 (Jul./Aug. 1992) pp. 1807–1819.

Xie et al., "Very high mobility two–dimensional hole gas in $Si/Ge_xSi_{1-x}/Ge$ structures grown by molecular beam eiptaxy," *Appl. Phys. Lett.,* vol. 63, No. 16 (Oct. 18, 1993) pp. 2263–2264.

(Continued)

*Primary Examiner*—John F. Niebling
*Assistant Examiner*—Christopher Lattin
(74) *Attorney, Agent, or Firm*—Testa Hurwitz & Thibeault LLP

(57) ABSTRACT

A structure includes a tensile strained layer disposed over a substrate, the tensile strained layer having a first thickness. A compressed layer is disposed between the tensile strained layer and the substrate, the compressed layer having a second thickness. The first and second thicknesses are selected to define a first carrier mobility in the tensile strained layer and a second carrier mobility in the compressed layer.

47 Claims, 13 Drawing Sheets

U.S. PATENT DOCUMENTS

| | | | |
|---|---|---|---|
| 5,534,713 A * | 7/1996 | Ismail et al. | 257/24 |
| 5,596,527 A | 1/1997 | Tomioka et al. | |
| 5,617,351 A | 4/1997 | Bertin et al. | |
| 5,683,934 A | 11/1997 | Candelaria | |
| 5,739,567 A | 4/1998 | Wong | |
| 5,777,347 A | 7/1998 | Bartelink | |
| 5,780,922 A | 7/1998 | Mishra et al. | |
| 5,786,612 A | 7/1998 | Otani et al. | |
| 5,792,679 A | 8/1998 | Nakato | |
| 5,808,344 A | 9/1998 | Ismail et al. | |
| 5,847,419 A * | 12/1998 | Imai et al. | 257/192 |
| 5,891,769 A | 4/1999 | Liaw et al. | |
| 5,906,951 A | 5/1999 | Chu et al. | |
| 5,963,817 A | 10/1999 | Chu et al. | |
| 5,986,287 A | 11/1999 | Eberl et al. | |
| 5,998,807 A | 12/1999 | Lustig et al. | |
| 6,013,134 A | 1/2000 | Chu et al. | |
| 6,058,044 A | 5/2000 | Sugiura et al. | |
| 6,059,895 A | 5/2000 | Chu et al. | |
| 6,096,590 A | 8/2000 | Chan et al. | |
| 6,107,653 A | 8/2000 | Fitzgerald | |
| 6,111,267 A | 8/2000 | Fischer et al. | |
| 6,117,750 A | 9/2000 | Bensahel et al. | |
| 6,130,453 A | 10/2000 | Mei et al. | |
| 6,143,636 A | 11/2000 | Forbes et al. | |
| 6,204,529 B1 | 3/2001 | Lung et al. | |
| 6,207,977 B1 | 3/2001 | Augusto | |
| 6,249,022 B1 | 6/2001 | Lin et al. | |
| 6,251,755 B1 | 6/2001 | Furukawa et al. | |
| 6,266,278 B1 | 7/2001 | Harari et al. | |
| 6,339,232 B1 | 1/2002 | Takagi | |
| 6,350,993 B1 | 2/2002 | Chu et al. | |
| 6,399,970 B2 | 6/2002 | Kubo et al. | |
| 6,498,359 B2 | 12/2002 | Schmidt et al. | |
| 6,555,839 B2 | 4/2003 | Fitzgerold | |
| 6,583,437 B2 | 6/2003 | Mizuno et al. | |
| 6,593,191 B2 | 7/2003 | Fitzgerald | |
| 6,593,641 B1 | 7/2003 | Fitzgerald | |
| 6,600,170 B1 | 7/2003 | Xiang | |
| 6,649,480 B2 | 11/2003 | Fitzgerald et al. | |
| 2001/0003364 A1 | 6/2001 | Sugawara et al. | |
| 2002/0100942 A1 | 8/2002 | Fitzgerald et al. | |
| 2002/0125471 A1 | 9/2002 | Fitzgerald et al. | |
| 2002/0125497 A1 | 9/2002 | Fitzgerald | |
| 2002/0140031 A1 | 10/2002 | Rim | |
| 2003/0052334 A1 | 3/2003 | Lee et al. | |

FOREIGN PATENT DOCUMENTS

| | | |
|---|---|---|
| EP | 1 174 928 A1 | 1/2002 |
| JP | 63122176 | 5/1988 |
| JP | 4-307974 | 10/1992 |
| JP | 7-106446 | 4/1995 |
| JP | 11-233744 | 8/1999 |
| JP | 2001319935 | 5/2000 |
| JP | 02241195 | 8/2002 |
| WO | WO 98/59365 | 12/1998 |
| WO | WO 99/53539 | 10/1999 |
| WO | WO 00/54338 | 9/2000 |
| WO | WO 01/54202 A1 | 7/2001 |
| WO | WO 01/9338 A1 | 12/2001 |
| WO | WO 01/99169 A2 | 12/2001 |
| WO | WO 02/13262 A2 | 2/2002 |
| WO | WO 02/15244 A2 | 2/2002 |
| WO | WO 02/47168 A2 | 6/2002 |
| WO | WO 02/071488 A1 | 9/2002 |
| WO | WO 02/071491 A1 | 9/2002 |
| WO | WO 02/071495 A1 | 9/2002 |

OTHER PUBLICATIONS

Wesler et al., "Electron Mobility Enhancement in Strained–Si N–Type Metal–Oxide–Semiconductor Field–Effect Transistors," *IEEE Electron Device Letters*, vol. 15, No. 3 (Mar. 1994) pp. 100–102.

Ismail et al., "Modulation–doped n–type Si/SiGe with inverted interface," *Appl. Phys. Lett.*, vol. 65, No. 10 (Sep. 5, 1994) pp. 1248–1250.

Xie et al., "Semiconductor Surface Roughness: Dependence on Sign and Magnitude of Bulk Strain," *The Physical Review Letters*, vol. 73, No. 22 (Nov. 28, 1994) pp. 3006–3009.

Bouillon et al., "Search for the optimal channel architecture for 0.18/0.12 $\mu$m bulk CMOS Experimental study," *IEEE* (1996) pp. 21.2.1–21.2.4.

Kearney et al., "The effect of alloy scattering on the mobility of holes in a $Si_{1-x}Ge_x$ quantum well," *Semicond. Sci Technol.*, vol. 13 (1998) pp. 174–180.

Höck et al., "High performance 0.25 $\mu$m p–type Ge/SiGe MODFETs," *Electronics Letters*, vol. 34, No. 19 (Sep. 17, 1998) pp. 1888–1889.

Bufler et al., "Hole transport in strained $Si_{1-x}$ $Ge_x$ alloys on $Si_{1-y}Ge_y$ substrates," *Journal of Applied Physics*, vol. 84, No. 10 (Nov. 15, 1998) pp. 5597–5602.

Fitzgerald et al., "Dislocation dynamics in relaxed graded composition semiconductors," *Materials Science and Engineering B67* (1999) pp. 53–61.

Fischetti, "Long–range Coulomb interactions in small Si devices. Part II. Effective electronmobility in thin–oxide structures," *Journal of Applied Physics*, vol. 89, No. 2 (Jan. 15, 2001) pp. 1232–1250.

Cheng et al., "Electron Mobility Enhancement in Strained–Sin–MOSFETs Fabricated on SiGe–on–Insulator (SGOI) Substrates," *IEEE Electron Device Letters*, vol. 22, No. 7 (Jul. 2001) pp. 321–323.

Leitz et al., "Dislocation glide and blocking kinetics in compositionally graded SiGe/Si," *Journal of Applied Physics*, vol. 90, No. 6 (Sep. 15, 2001) pp. 2730–2736.

Currie et al., "Carrier mobilities and process stability of strained Si n– and p–MOSFETs on SiGe virtual substrates," *J. Vac. Sci. Technol. B.*, vol. 19, No. 6 (Nov./Dec. 2001) pp. 2268–2279.

Ransom et al., "Gate–Self–Aligned n–channel and p–channel Germanium MOSFET's," *IEEE Transactions on Electron Devices*, vol. 38, No. 12 (Dec. 1991) pp. 2695.

König et al., "p–Type Ge–Channel MODFET's with High Transconductance Grown on Si Substrates," *IEEE Electron Device Letters*, vol. 14, No. 4 (Apr. 1993) pp. 205–207.

Fischetti et al., "Band structure, deformation potentials, and carrier mobility in strained Si, Ge, and SiGe alloys," *J. Appl. Phys.*, vol. 80, No. 4 (Aug. 15, 1996) pp. 2234–2252.

Currie et al., "Controlling threading dislocation densities in Ge on Si using graded SiGe layers and chemical–mechanical polishing," *Applied Physics Letters*, vol. 72 No. 14 (Apr. 6, 1998) pp. 1718–1720.

Reinking et al., "Fabrication of high–mobility Ge p–channel MOSFETs on Si substrates," *Electronics Letters*, vol. 35, No. 6 (Mar. 18, 1999) pp. 503–504.

Koester et al., "Extremely High Transconductance $Ge/Si_{0.4}Ge_{0.6}$ p–MODFET's Grown by UHV–CVD," *IEEE Electron Device Letters*, vol. 21, No. 3 (Mar. 2000) pp. 110–112.

Carlin et al., "High Efficiency GaAs–on–Si Solar Cells with High $V_{oc}$ Using Graded GeSi Buffers," *IEEE* (2000) pp. 1006–1011.

Rosenblad et al., "Virtual Substrates for the n– and p–type Si–MODFET Grown at Very High Rates," *Materials Science and Engineering*, vol. B74 (2000) pp. 113–117.

Ueno et al., "Low Temperature Buffer Growth for Modulation Doped SiGe/Ge/SiGe Heterostructures with High Hole Mobility," *Thin Solid Films*, vol. 369 (2000) pp. 320–323.

Yousif et al., "Recent Critical Issues in Si/Si$_{1-x}$Ge$_x$/Si Heterostructure FET Devices," *Solid–State Electronics*, vol. 45, No. 11 (2001) pp. 1931–1937.

Anonymous, "Germanium P–Channel Mosfet," *IBM Technical Disclosure Bulletin*, vol. 28, No. 2 (Jul. 1, 1985) p. 500.

Aigouy et al., "MOVPE Growth and optical characterization of ZnSe/ZnS strained layer superlattices," *Superlattices and Microstructures*, vol. 16, No. 1 (1994) pp. 71–76.

Kikkawa et al., "Effect of strained InGaAs step bunching on mobility and device performance in n–InGaP/InGaAs/GaAs pseudomorphic heterostructures grown by metalorganic vapor phase epitaxy," *Journal of Crystal Growth*, vol. 145 (1994) pp. 799–807.

Pelekanos et al., "Interface roughness correlation in CdTe/CdZnTe strained quantum wells," *Journal of Crystal Growth*, vol. 184/185 (1998) pp. 886–889.

Srolovitz, "On the Stability of Surfaces of Stressed Solids," *Acta metall.*, vol. 37, No. 2 (1989) pp. 621–625.

Cullis et al, "The characteristics of strain–modulated surface undulations formed upon epitaxial Si$_{1-x}$Ge$_x$ alloy layers on Si," *Journal of Crystal Growth*, vol. 123 (1992) pp. 333–343.

Wolf et al., "Silicon Processing for the VLSI Era, Volume 1: Process Technology" (1986) pp. 201.

International Search Report for PCT/US03/17275, dated Oct. 14, 2003.

König et al., "SiGe HBTs and HFETs," *Solid–State Electronics*, vol. 38, No. 9 (1995) pp. 1595–1602.

Armstrong et al., "Design of Si/SiGe Heterojunction Complementary Metal–Oxide–Semiconductor Transistors," *IEDM Technical Digest* (1995) pp. 761–764.

Sadek et al., "Design of Si/SiGe Heterojunction Complementary Metal–Oxide–Semiconductor Transistors," *IEEE Trans. Electron Devices* (Aug. 1996) pp. 1224–1232.

Schäffler, "High–Mobility Si and Ge Structures," *Semiconductor Science and Technology*, vol. 12 (1997) pp. 1515–1549.

Höck et al., "Carrier mobilities in modulation doped Si$_{1-x}$Ge$_x$ heterostructures with respect to FET applications," *Thin Solid Films*, vol. 336 (1998) pp. 141–144.

Hackbarth et al., "Strain relieved SiGe buffers for Si–based heterostructure field–effect transistors," *Journal of Crystal Growth*, vol. 201/202 (1999) pp. 734–738.

Xie, "SiGe Field effect transistors," *Materials Science and Engineering*, vol. 25 (1999) pp. 89–121.

Armstrong, "Technology for SiGe Heterostructure–Based CMOS Devices", Submitted to the Massachusetts Institute of Technology Department of Electrical Engineering and Computer Science on Jun. 30, 1999, pp. 1–154.

Höck et al., "High hole mobility in Si$_{0.17}$Ge$_{0.83}$ channel metal–oxide–semiconductor field–effect transistors grown by plasma–enhanced chemical vapor deposition," *Applied Physics Letters*, vol. 76, No. 26 (Jun. 26, 2000) pp. 3920–3922.

Cheng et al., "Relaxed Silicon–Germanium on Insulator Substrate by Layer Transfer," *Journal of Electronic Materials*, vol. 30, No. 12 (2001) pp. L37–L39.

Lee et al., "Strained Ge channel p–type metal–oxide–semiconductor field–effect transistors grown on Si$_{1-x}$Ge$_x$/Si virtual substrates," *Applied Physics Letters*, vol. 79, No. 20 (Nov. 12, 2001) pp. 3344–3346.

Leitz et al., "Hole mobility enhancements in strained Si/Si$_{1-y}$Ge$_y$ p–type metal–oxide–semiconductor field–effect transistors grown on relaxed Si$_{1-x}$Ge$_x$ (x<y) virtual substrates," *Applied Physics Letters*, vol. 79, No. 25 (Dec. 17, 2001) pp. 4246–4248.

Lee et al., "Strained Ge channel p–type MOSFETs fabricated on Si$_{1-x}$Ge$_x$/Si virtual substrates," *Mat. Res. Soc. Symp. Proc.*, vol. 686 (2002) pp. A1.9.1–A1.9.5.

Leitz et al., "Channel Engineering of SiGe–Based Heterostructures for High Mobility MOSFETs," *Mat. Res. Soc. Symp. Proc.*, vol. 686 (2002) pp. A3.10.1–A3.10.6.

Li et al., "Design of high speed Si/SiGe heterojunction complementary metal–oxide–semiconductor field effect transistors with reduced short–channel effects," *J. Vac. Sci. Technol.*, A 20(3) (May/Jun. 2002) pp. 1030–1033.

"2 Bit/Cell EEPROM Cell Using Band to Band Tunneling for Data Read–Out," IBM Technical Disclosure Bulletin, vol. 35, No. 4B (Sep. 1992) pp. 136–140.

Wesler et al., "NMOS and PMOS Transistors Fabricated in Strained Silicon/Relaxed Silicon–Germanium Structures," *Electron Devices Meeting, 1992, Technical Digest* (Dec. 13, 1992) pp. 31.7.1–31.7.3.

Welser et al., "Evidence of Real–Space Hot–Electron Transfer in High Mobility, Strained–Si Multilayer MOSFETs," *Electron Devices meetings, 1993, Technical Digest* (Dec. 1993) pp. 21.3.1–21.3.4.

Wesler, "The Application of Strained Silicon/Relaxed Silicon Germanium Heterostructures to Metal–Oxide–Semiconducor Field–Effect Transistors," Ph.D. Thesis, Stanford University (1995) pp. 1–205.

Nayak et al., "High Mobility Strained–Si PMOSFET's," *IEEE Transactions on Electron Devices*, vol. 43, No. 10 (Oct. 1996) pp. 1709–1716.

Usami et al., "Spectroscopic study of Si–based quantum wells with neighboring confinement structure," *Semicon. Sci. Technol.* (1997) (astract).

König et al., "Design Rules for n–Type SiGe Hetero FETs," *Solid State Electronics*, vol. 41, No. 10 (1997), pp. 1541–1547.

Maiti et al., "Strained–Si heterostructure field effect transistors," *Semicond. Sci. Technol.*, vol. 13 (1998) pp. 1225–1246.

O'Neill et al., "SiGe Virtual substrate N–channel heterojunction MOSFETS," *Semicond. Sci. Technol.*, vol. 14 (1999) pp. 784–789.

Parker et al., "SiGe heterostructure CMOS circuits and applications," *Solid State Electronics*, vol. 43 No. 8, (Aug. 1999) pp. 1497–1506.

Rim, "Application of Silicon–Based Heterostructures to Enhanced Mobility Metal–Oxide–Semiconductor Field–Effect Transistors", Ph.D. Thesis, Stanford University (1999) pp. 1–184.

Hackbarth et al., "Alternatives to thick MBE–grown relaxed SiGe buffers," *Thin Solid Films*, vol. 369, No. 1–2 (2000) pp. 148–151.

Herzog et al., "SiGe–based FETs: buffer issues and device results," *Thin Solid Films*, vol. 380 (2000) pp. 36–41.

Mizuno et al., "Electron and Hole Mobility Enhancement in Strained–Si MOSFET's on SiGe–on–Insulator Substrates Fabricated by SIMOX Technology," *IEEE Electron Device Letters,* vol. 21, No. 5 (May 2000) pp. 230–232.

Rim et al., "Fabrication and Analysis of Deep Submicron Strained–Si N–MOSFET's"; *IEEE Transactions on Electron Devices,* vol. 47, No. 7 (Jul. 2000) pp. 1406–1415.

Barradas et al., "RBS analysis of MBE–grown SiGe/(001) Si heterostructures with thin, high Ge content SiGe channels for HMOS transistors," *Modern Physics Letters B* (2001) (abstract).

Canaperi et al., "Preparation of a relaxed Si–Ge layer on an insulator in fabricating high–speed semiconductor devices with strained expitaxial films," *International Business Machines Corporation,* USA (2002) (abstract).

Rim et al., "Enhanced Hole Mobilities in Surface–Channel Strained–Si p–MOSFETs," Solid State Electronics Laboratory, Stanford University Stanford, CA 94305, pp. 20.3.1–20.3.4.

Meyerson et al., "Cooperative Growth Phenomena in Silicon/Germanium Low–Temperature Epitaxy," *Applied Physics Letters,* vol. 53, No. 25 (Dec. 19, 1988) pp. 2555–2557.

Garone et al., "Silicon vapor phase epitaxial growth catalysis by the presence of germane," *Applied Physics Letters,* vol. 56, No. 13 (Mar. 26, 1990) pp. 1275–1277.

Robbins et al., "A model for heterogeneous growth of $Si_{1-x}Ge_x$ films for hydrides," *Journal of Applied Physics,* vol. 69, No. 6 (Mar. 15, 1991) pp. 3729–3732.

Grützmacher et al., "Ge segregation in SiGe/Si heterostructures and its dependence on deposition technique and growth atmosphere," *Applied Physics Letters,* vol. 63, No. 18 (Nov. 1, 1993) pp. 2531–2533.

Cullis et al, "Growth ripples upon strained SiGe epitaxial layers on Si and misfit dislocation interactions," *Journal of Vacuum Science and Technology A,* vol. 12, No. 4 (Jul./Aug. 1994) pp. 1924–1931.

Tweet et al., "Factors determining the composition of strained GeSi layers grown with disilane and germane," *Applied Physics Letters,* vol. 65, No. 20 (Nov. 14, 1994) pp. 2579–2581.

\* cited by examiner

US 6,916,727 B2

ENHANCEMENT OF P-TYPE METAL-OXIDE-SEMICONDUCTOR FIELD EFFECT TRANSISTORS

RELATED APPLICATIONS

This application claims the benefit of U.S. Provisional Application No. 60/299,986, filed Jun. 21, 2001, and U.S. Provisional Application No. 60/310,346, filed Aug. 6, 2001, the entire disclosures of which are hereby incorporated by reference herein.

GOVERNMENT SUPPORT

This invention was made with government support under Grant Number N66001-00-1-8954, awarded by the U.S. Navy. The government has certain rights in the invention.

FIELD OF THE INVENTION

This invention relates generally to semiconductor structures and particularly to semiconductor structures formed on strained semiconductor layers.

BACKGROUND

Relaxed silicon-germanium (SiGe) virtual substrates with low defect densities are an advantageous platform for integration of high-speed heterostructure metal-oxide-semiconductor field-effect transistors (MOSFETs) onto silicon substrates. Enhanced performance of n-type MOSFETs (NMOS transistors) has been demonstrated with heterojunction MOSFETs built on substrates having strained silicon (Si) and relaxed SiGe layers. Tensile strained silicon greatly enhances electron mobilities. NMOS devices with strained silicon surface channels, therefore, have improved performance with higher switching speeds. Hole mobilities are enhanced in tensile strained silicon as well, but to a lesser extent for strain levels less than approximately 1.5%. Accordingly, equivalent enhancement of p-type MOS (PMOS) device performance in such surface-channel devices presents a challenge.

In bulk Si, the ratio of electron mobility to hole mobility is approximately 2. Therefore, even with symmetric mobility enhancements over bulk Si, hole mobility in strained Si PMOS devices is still considerably lower than electron mobility in strained Si NMOS devices. Low hole mobilities require increased PMOS gate widths to compensate for the reduced drive currents of PMOS devices. The resulting increased chip area taken up by PMOS devices consumes valuable device space, while the mismatch in NMOS and PMOS areas reduces logic speed through capacitive delays. Symmetric current drive from NMOS and PMOS, theoretically attainable through symmetric, i.e., equal, electron and hole mobilities would eliminate this source of capacitive delay, thereby increasing overall circuit speed. Device heterostructures with symmetric electron and hole mobilities, however, are not yet available. These factors encourage circuit designers to avoid PMOS in logic circuits whenever possible.

High mobility layers offer improvements for PMOS design. A promising route for integration of high hole mobility devices with high electron mobility strained Si NMOS devices is through the use of buried, compressively strained $Si_{1-y}Ge_y$ layers and surface strained Si layers, grown on a relaxed $Si_{1-x}Ge_x$ virtual substrate (x<y), hereafter referred to as "dual channel heterostructures." Dual channel heterostructures allow simultaneous integration of hole and electron channel devices within the same layer sequence. While the high mobility of compressively strained Ge-rich hole channels in modulation doped layers has been well documented, devices based upon these layers are typically Schottky-gated and depletion mode, both of which are incompatible with mainstream Si CMOS schemes.

Theoretical and experimental results, however, indicate that dual channel structures provide worthwhile PMOS device performance without the need for modulation doping, while retaining a high quality silicon/silicon dioxide (Si/$SiO_2$) interface. For example, the combination of a buried compressively strained $Si_{0.17}Ge_{0.83}$ channel and a surface tensile strained Si channel provides room temperature hole mobilities of over 700 $cm^2$V-s (see, e.g., G. Hoeck et al., Appl. Phys. Lett., 76:3920, 2000, incorporated herein by reference). This concept has also been extended to pure Ge channel MOSFETs, in which even higher hole mobility enhancements have been attained (see, e.g., M. L. Lee, et al., Applied Physics Letters 79:3344, 2001, incorporated herein by reference). Furthermore, simulations reveal that electron mobility in the strained Si surface channel is not degraded by the presence of the buried SiGe layer, making this structure suitable for both electron and hole channel devices (see, e.g., M. A. Armstrong, Ph.D. Thesis, MIT, 1999).

SUMMARY

Through design of channel engineering parameters, such as buried channel composition and surface channel thickness, a wide range of performance enhancements in dual channel heterostructure-based PMOS devices is possible. In some embodiments, the presence of a buried compressively strained SiGe channel eliminates parasitic conduction of holes through the low-mobility relaxed SiGe virtual substrate. By maximizing band offsets between the surface channel and the buried channel, hole conduction through the high mobility buried channel is maximized at low vertical fields. Reduction of the strained Si surface channel thickness prevents hole occupation in the strained Si surface channel at high vertical fields, preserving low-field hole mobility enhancements.

In an aspect, the invention features a structure having a tensile strained layer disposed over a substrate, the tensile strained layer having a first thickness. The structure also has a compressed layer disposed between the tensile strained layer and the substrate, the compressed layer having a second thickness. The first and second thicknesses are selected to define a first carrier mobility in the tensile strained layer and a second carrier mobility in the compressed layer.

One or more of the following features may also be included. The first carrier mobility may include an electron mobility and the second carrier mobility may include a hole mobility. The first and second thicknesses may be selected to maximize an average carrier mobility. The tensile strained layer may include Si. The compressed layer may include $Si_{1-y}Ge_y$. An insulating layer may disposed between the substrate and the compressed layer.

A relaxed layer may be disposed between the tensile strained layer and the substrate, the relaxed layer including $Si_{i-x}Ge_x$, x being less than y. The germanium contents y and x may be selected to define the second carrier mobility in the compressed layer and/or to maximize an average carrier mobility. A graded layer may be disposed over the substrate, the graded layer including SiGe.

A transistor may be disposed on the tensile strained layer. The transistor may include: (i) a gate dielectric portion disposed over a portion of the tensile strained layer; (ii) a gate disposed over the first gate dielectric; and (iii) a source and a drain disposed in a portion of the tensile strained layer and proximate the gate dielectric. Application of an operating voltage to the gate results in the population of the tensile strained layer and compressed layer by charge carriers, such as electrons or holes.

In another aspect, the invention features a structure including a compressed semiconductor layer disposed over a substrate, and a tensile strained layer disposed over at least a portion of the compressed layer. The structure also includes a p-type metal-oxide-semiconductor (PMOS) transistor having (i) a dielectric layer disposed over a portion of the tensile strained layer; (ii) a gate disposed over a portion of the dielectric layer, the gate including a first conducting layer; and (iii) a first source and a first drain disposed in a portion of the tensile strained layer and proximate the gate dielectric portion, the first source and first drain including p-type dopants. The PMOS transistor has a first hole mobility enhancement, the first hole mobility enhancement decreasing at a slower rate as a function of increasing vertical field than a second hole mobility of a PMOS transistor formed on a second substrate including a strained silicon layer, the second substrate being substantially free of a compressed layer.

The following feature may also be included. The slower rate of the first hole mobility enhancement decrease as a function of increasing vertical field may be approximately zero.

In yet another aspect, the invention features a structure including a compressed semiconductor layer disposed over a substrate and a tensile strained layer disposed over at least a first portion of the compressed layer. The structure also includes a p-type metal-oxide-semiconductor (PMOS) transistor having (i) a first gate dielectric portion disposed over a second portion of the compressed layer, (ii) a first gate disposed over the first gate dielectric portion, the first gate including a first conducting layer, and (iii) a first source and a first drain disposed in a region of the compressed semiconductor layer and proximate the first gate dielectric portion, the first source and first drain including p-type dopants. The structure also includes an n-type metal-oxide-semiconductor (NMOS) transistor having (i) a second gate dielectric portion disposed over a portion of the tensile strained layer, (ii) a second gate disposed over the second gate dielectric portion, the second gate including a second conducting layer, and (iii) a second source and a second drain disposed in a region of the tensile strained layer and proximate the second gate dielectric portion, the second source and second drain including n-type dopants. During operation of the PMOS transistor, holes travel from the first source to the first drain through a channel including the second compressed layer portion disposed under the first gate and during operation of the NMOS transistor, electrons travel from the second source to the second drain through a channel including the tensile layer portion disposed under the second gate.

One or more of the following features may also be included. The second portion of the compressed layer may be substantially separate from the first portion, such that the first gate dielectric portion is in contact with the second portion of the compressed layer. The second portion of the compressed layer may include the first portion of the compressed layer and the first gate dielectric portion may be disposed over a second portion of the tensile strained layer. The PMOS transistor may have a p-type carrier mobility enhancement with respect to a PMOS transistor formed in bulk silicon, and the NMOS transistor may have an n-type carrier mobility enhancement with respect to an NMOS transistor formed in bulk silicon, with the enhancement of p-type carrier mobility being at least approximately equal to the enhancement of n-type carrier mobility. The PMOS transistor may have a p-type carrier mobility, NMOS transistor may have an n-type carrier mobility, and a ratio of the n-type carrier mobility to the p-type carrier mobility may be less than approximately 2.

In another aspect, the invention features a method for forming a structure, including forming a compressed layer over a substrate, the compressed layer having a first thickness, and forming a tensile strained layer over the compressed layer, the tensile strained layer having a second thickness. Forming the compressed and tensile strained layers includes selecting the first and second thicknesses to define a first carrier mobility in the compressed layer and a second carrier mobility in the tensile strained layer.

One or more of the following features may be included. The compressed layer may include Ge. The tensile strained layer may include Si.

In yet another aspect, the invention features a method for forming a structure, including forming a compressed layer over a substrate, and forming a tensile strained layer over at least a portion of the compressed layer. The method also includes forming a p-type metal-oxide-semiconductor (PMOS) transistor by (i) forming a dielectric layer over a portion of the tensile strained layer, (ii) forming a gate over a portion of the dielectric layer, the gate including a conducting layer; and (iii) forming a source and a drain in a portion of the tensile strained layer and proximate the gate dielectric portion, the first source and first drain including p-type dopants. Forming the compressed and tensile strained layers and PMOS transistor includes selecting layer and transistor components such that applying an operating voltage to the gate populates a region of the tensile strained layer and a region of the compressed layer with a plurality of charge carriers.

In a another aspect, the invention features a method for forming a structure, the method including forming a relaxed semiconductor layer over a substrate, forming a compressed semiconductor layer over at least a portion of the relaxed semiconductor layer, and forming a tensile strained layer over at least a portion of the compressed layer. A p-type metal-oxide-semiconductor (PMOS) transistor is formed by (i) forming a dielectric layer over a portion of the tensile strained layer, (ii) forming a gate over a portion of the dielectric layer, the gate including a first conducting layer; and (iii) forming a first source and a first drain in a portion of the tensile strained layer and proximate the gate dielectric portion, the first source and first drain including p-type dopants. Forming the relaxed, compressed, and tensile strained layers and the PMOS transistor include selecting layer and transistor components such that the PMOS transistor has a first hole mobility enhancement, the first hole mobility enhancement decreasing at a slower rate as a function of increasing vertical field than a second hole mobility of a PMOS transistor formed on a second substrate including a strained silicon layer, the second substrate being substantially free of a compressed layer.

The following feature may also be included. The first hole mobility enhancement decrease as a function of increasing vertical field may be approximately zero.

In another aspect, a method for forming a structure includes forming a compressed semiconductor layer over a substrate and forming a tensile strained layer over at least a first portion of the compressed layer. A p-type metal-oxidesemiconductor (PMOS) transistor is formed by (i) forming a first gate dielectric portion over a second portion of the compressed layer, (ii) forming a first gate over the first gate dielectric portion, the first gate including a first conducting layer, and (iii) forming a first source and a first drain in a region of the compressed semiconductor layer and proximate the first gate dielectric portion, the first source and first drain including p-type dopants. An n-type metal-oxide-semiconductor (NMOS) transistor may be formed by (i) forming a second gate dielectric portion over a portion of the tensile strained layer, (ii) forming a second gate over the second gate dielectric portion, the second gate including a second conducting layer, and (iii) forming a second source and a second drain in a region of the tensile strained layer and proximate the second gate dielectric portion, the second source and second drain including n-type dopants. During operation of the PMOS transistor, holes travel from the first source to the first drain through a channel including the second compressed layer portion disposed under the first gate and during operation of the NMOS transistor, electrons travel from the second source to the second drain through a channel including the tensile layer portion disposed under the second gate.

DETAILED DESCRIPTION

Figure 1:
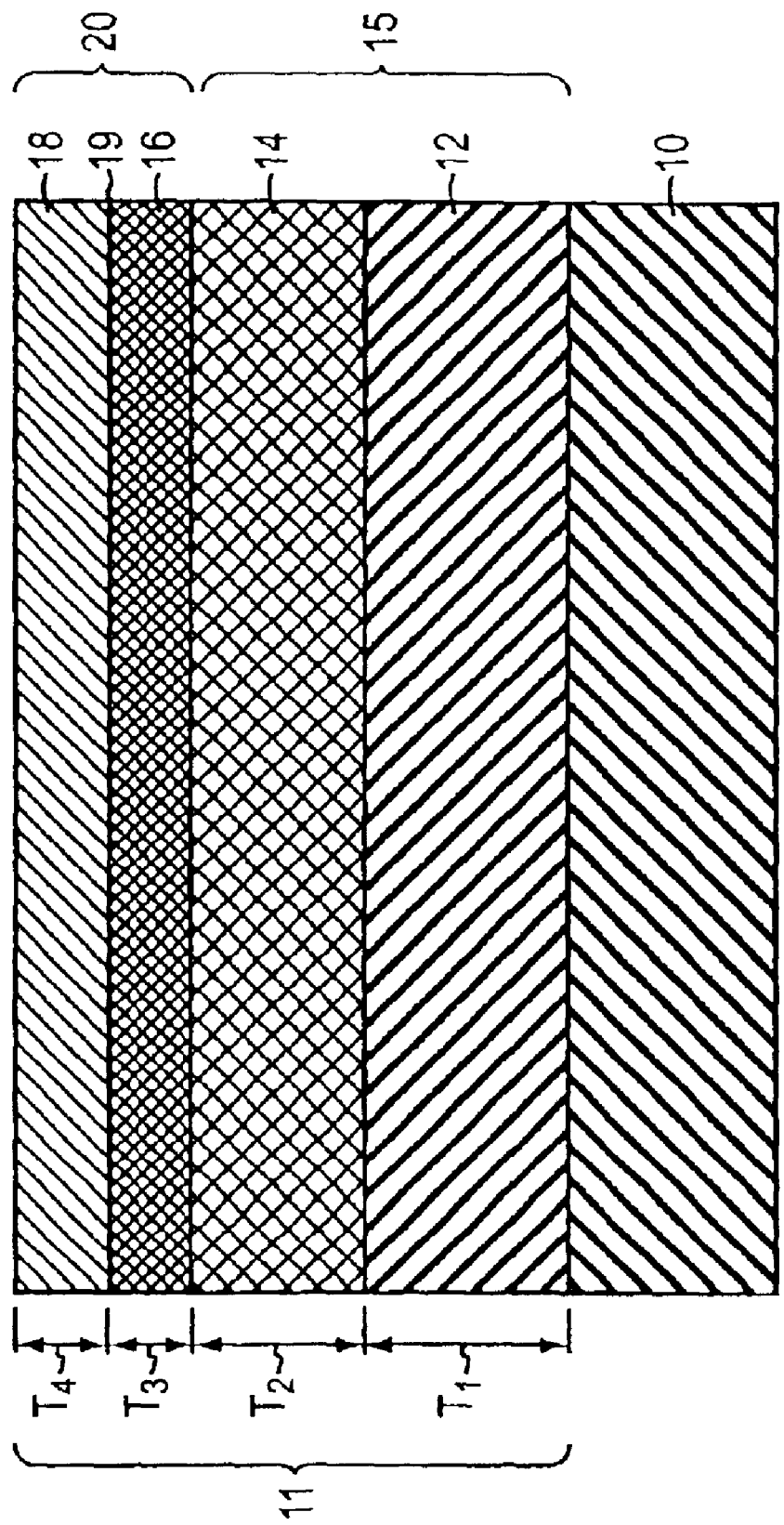
FIGS. 1–7 are a series of schematic cross-sectional views of a semiconductor substrate illustrating a process for fabricating a semiconductor structure on the substrate.

Referring to FIG. 1, which illustrates a structure amenable to use with the present invention, a substrate 10 is made of a semiconductor, such as silicon. Several layers collectively indicated at 11 are formed on substrate 10. Layers 11 may be grown in a chemical vapor deposition (CVD) system.

Layers 11 include a graded SiGe layer 12 disposed over substrate 10. Graded SiGe layer 12 has a grading rate of, for example, 10% Ge per micrometer ($\mu$m) of thickness, and a thickness $T_1$ of, for example, 2–9 $\mu$m, and is grown, for example, at 600–900° C. A relaxed $Si_{1-x}Ge_x$ layer 14 is disposed over graded SiGe layer 12. Relaxed $Si_{1-x}Ge_x$ layer 14 has a uniform composition and contains, for example, 20–90% Ge and has a thickness $T_2$ of, e.g., 0.2–2 $\mu$m. In an embodiment, $T_2$ is 1.5 $\mu$m. A virtual substrate 15 includes relaxed $Si_{1-x}Ge_x$ layer 14 and graded SiGe layer 12.

A compressed layer 16, under compressive strain, is disposed over relaxed $Si_{1-x}Ge_x$ layer 14. In an embodiment, compressed layer 16 includes $Si_{1-y}Ge_y$. Compressed $Si_{1-y}Ge_y$ layer 16 has a Ge content (y) higher than the Ge content (x) of relaxed $Si_{1-x}Ge_x$ layer 14. Compressed $Si_{1-y}Ge_y$ layer 16 contains, for example, 40–100% Ge and has a thickness $T_3$ of, e.g., 10–200 angstroms (Å). In an embodiment, compressed $Si_{1-y}Ge_y$ layer 16 thickness $T_3$ is approximately 100 Å.

A tensile strained layer 18 is disposed over compressed $Si_{1-y}Ge_y$ layer 16, sharing an interface 19 with compressed $Si_{1-y}Ge_y$ layer 16. In an embodiment, tensile strained layer 18 is formed of silicon. Tensile strained Si layer 18 has a starting thickness $T_4$ of, for example, 50–300 Å. In an embodiment, starting thickness $T_4$ is approximately 200 Å.

Substrate 10 with layers 11 typically has a threading dislocation density of $10^5/cm^2$. A suitable substrate 10 with layers 11 can be readily obtained from, e.g., IQE Silicon Compounds, Ltd., UK.

The requirements for attaining planar $Si_{1-y}Ge_y$ layers 16 and an acceptably high growth rate for the strained Si layer 18 via CVD are sometimes mutually exclusive. In an embodiment, device layers 20, including compressed $Si_{1-y}Ge_y$ layer 16 and tensile strained Si layer 18, may be deposited at a temperature that permits deposition of planar $Si_{1-y}Ge_y$ layers 16 and simultaneously provides an acceptably high growth rate, e.g., >0.01 Å/s, for the strained silicon layer 18. This temperature may be, e.g. 550° C. in ultrahigh vacuum chemical vapor deposition using $SiH_4$ and $GeH_4$ source gases. This embodiment may be especially suitable for compressed $Si_{1-y}Ge_y$ layers 16 with relatively low Ge content, e.g., y~0.6, under relatively light compressive strain, e.g., y–x≈0.2. In an alternative embodiment, compressed $Si_{1-y}Ge_y$ layer 16 may be deposited at a low enough temperature to permit deposition of planar $Si_{1-y}Ge_y$ layers but may not provide a suitable high growth rate for strained silicon layer 18. This deposition temperature may be, e.g., 400° C. in ultrahigh vacuum chemical vapor deposition using $SiH_4$ and $GeH_4$ source gases. The strained silicon layer 18 may then be grown by a two step process, in which the silicon gas precursor, e.g., $SiH_4$, is flowed while the growth temperature is slowly raised to a final desired temperature in which the silicon growth rate is acceptably high (e.g. 550° C. in ultrahigh vacuum chemical vapor deposition using $SiH_4$ and $GeH_4$ source gases). This step allows enough silicon to deposit at low temperature to help stabilize the compressed $Si_{1-y}Ge_y$ layer 16 against strain-induced undulations. Then, deposition of tensile strained Si layer 18 may be completed at the final deposition temperature, e.g., 550° C. in ultrahigh vacuum chemical vapor deposition using $SiH_4$ and $GeH_4$ source gases. In some embodiments, both $T_3$ of compressed $Si_{1-y}Ge_y$ layer 16 and $T_4$ of tensile strained Si layer 18 are 85 Å.

Figure 2:
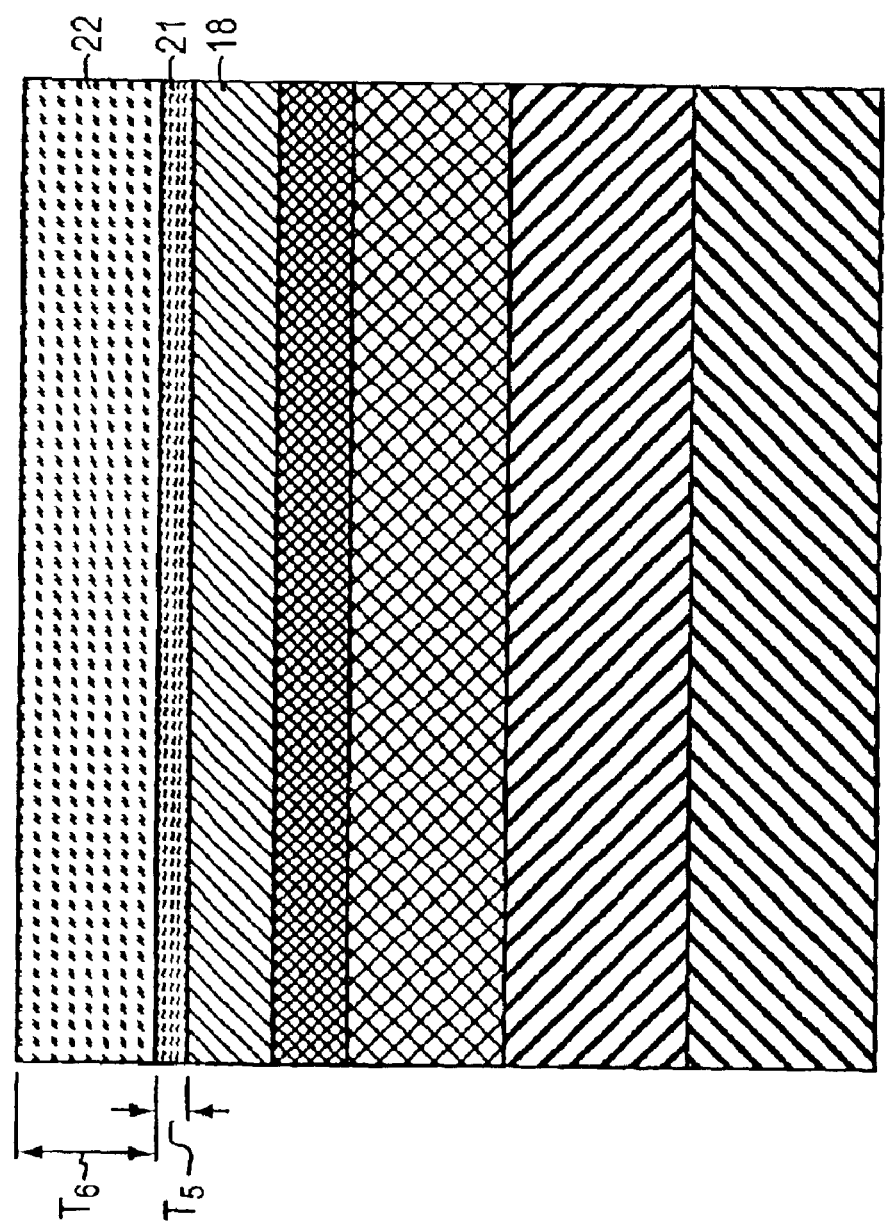

A PMOS transistor and an NMOS transistor are fabricated on substrate 10 and layers 11 as described below with reference to FIGS. 2–7. Referring to FIG. 2, a first masking layer 21, such as a pad silicon dioxide layer, hereinafter referred to as pad oxide 21, is deposited over tensile strained Si layer 18 by a deposition method such as low-pressure chemical vapor deposition (LPCVD). Pad oxide 21 has a thickness $T_5$ of, e.g., 100 Å. Subsequently, a second masking layer 22, such as a masking silicon nitride layer, hereinafter referred to as masking nitride 22, is deposited over pad oxide 21 by a deposition method such as plasma enhanced chemical vapor deposition (PECVD). Masking nitride 22 has a thickness $T_6$ of, for example, 500–1000 Å.

Figure 3:
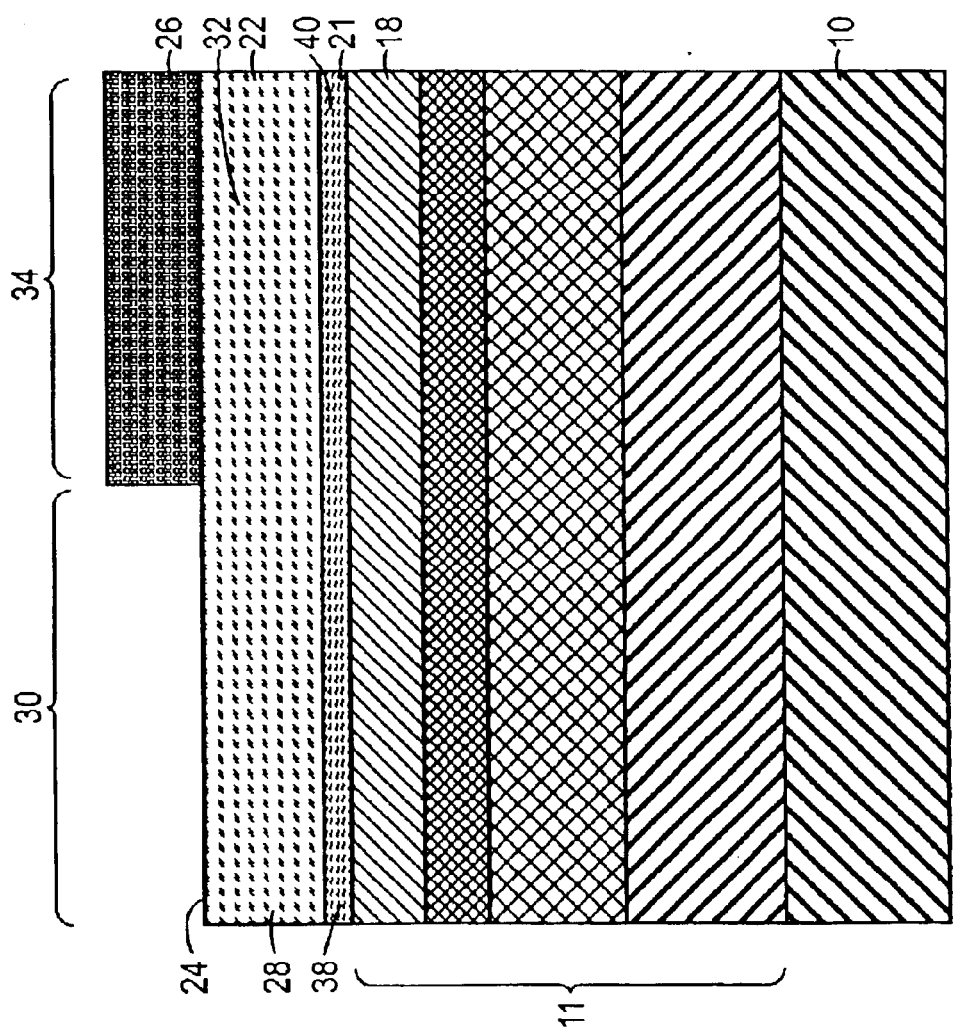

Referring to FIG. 3, a photoresist layer is deposited over a top surface 24 of masking nitride 22 and patterned to form a photoresist mask 26. Photoresist mask 26 exposes top surface 24 of a first portion 28 of masking nitride 22 disposed over a first region 30 of substrate 10 and layers 11. A device such as a PMOS transistor may be formed in first region 30 with subsequent processing (see, e.g., PMOS transistor 60 in FIG. 7). Photoresist mask 26 covers top surface 24 of a second portion 32 of masking nitride 22 disposed over a second region 34 of substrate 10 and layers 11, including tensile strained Si layer 18. A device, such as an NMOS transistor, may be formed in second region 34 with subsequent processing (see, e.g., NMOS transistor 62 in FIG. 7).

Figure 4:
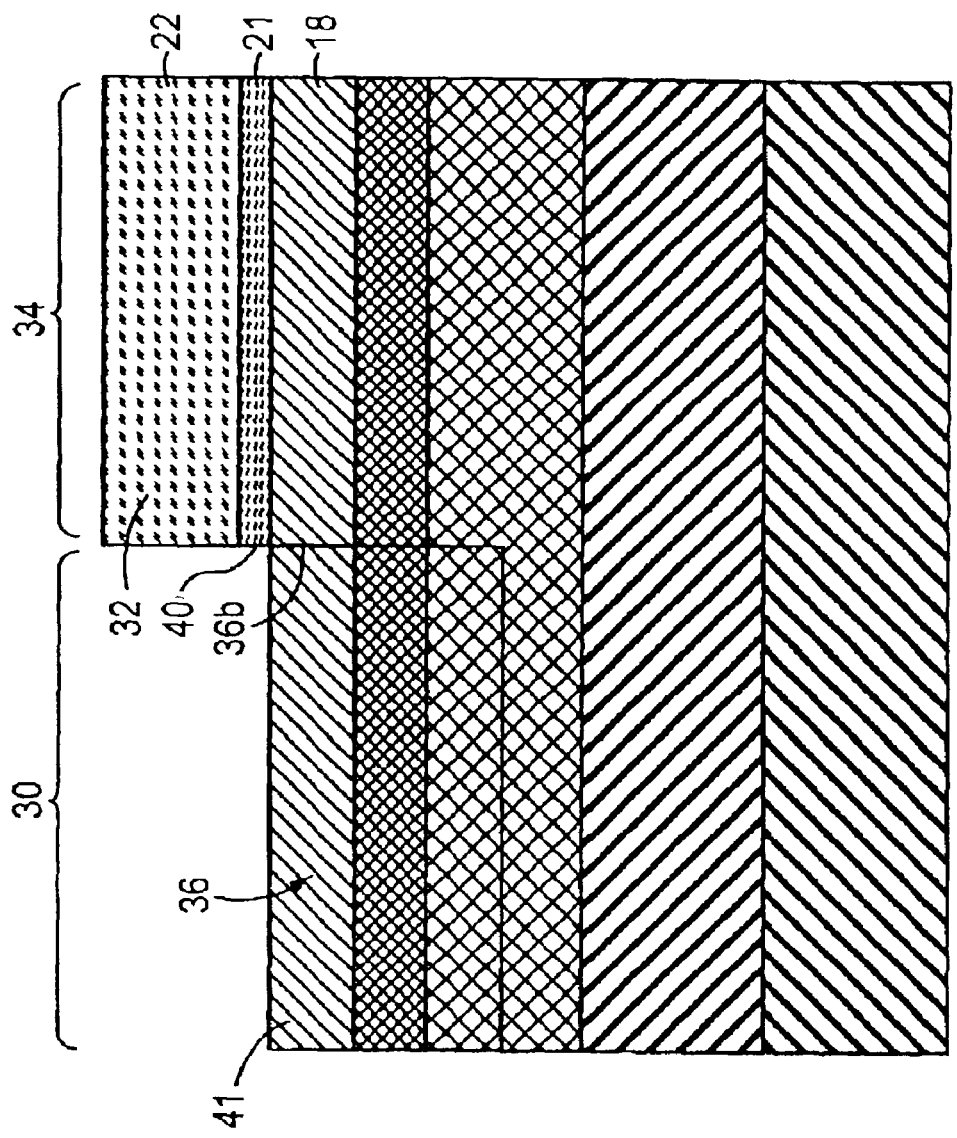

Referring to FIG. 3 and also to FIG. 4, first masking nitride portion 28 and a first portion 38 of pad oxide 21 underneath first masking nitride portion 28 are both removed, leaving behind second masking nitride portion 32 and a second portion 40 of pad oxide 21 that are protected by photoresist mask 26. Specifically, exposed first masking nitride portion 28 may be removed by a removal process such as a reactive ion etch (RIE) using gases such as a combination of nitrogen trifluoride, ammonia, and oxygen, or a combination of hydrogen bromide, chlorine, and oxygen. First pad oxide portion 38 may be removed by a wet etch that is selective to silicon, such as a hydrofluoric acid etch. The removal of pad oxide portion 38 exposes a portion 41 of tensile strained Si layer 18. Ions are introduced into areas not covered by photoresist mask 26, including first region 30, to form a well 36, defined, for purposes of illustration, by the boundary 36b. For example, n-type ions, such as phosphorus, are implanted to form well 36 for a PMOS transistor. The dosage and energy of the phosphorus ion implantation is, for example, 400 keV with $1.5 \times 10^{13}$ atoms/cm$^2$. After the selective removal of first portions 28, 38 of masking nitride 22 and pad oxide 21 and the formation of well 36, photoresist mask 26 is removed by a stripping process such as a dry strip in an oxygen plasma.

Figure 5:
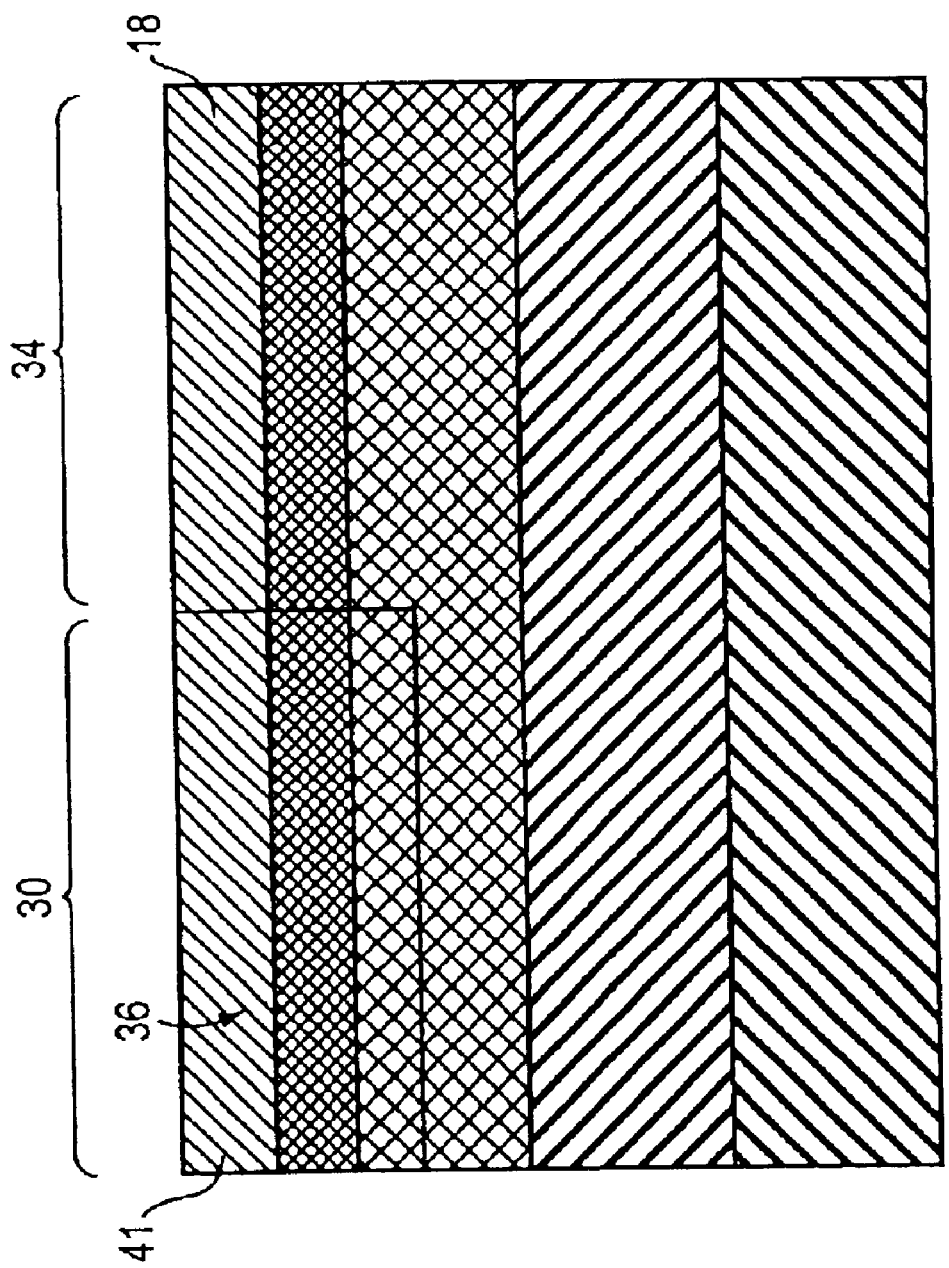

Referring to FIG. 4 and also to FIG. 5, portion 32 of masking nitride layer 22 in region 34 is removed by, for example, an RIE process. Subsequently, portion 40 of pad oxide 21 is removed with an oxide etch selective to silicon, such as a hydrofluoric acid etch.

Figure 6:
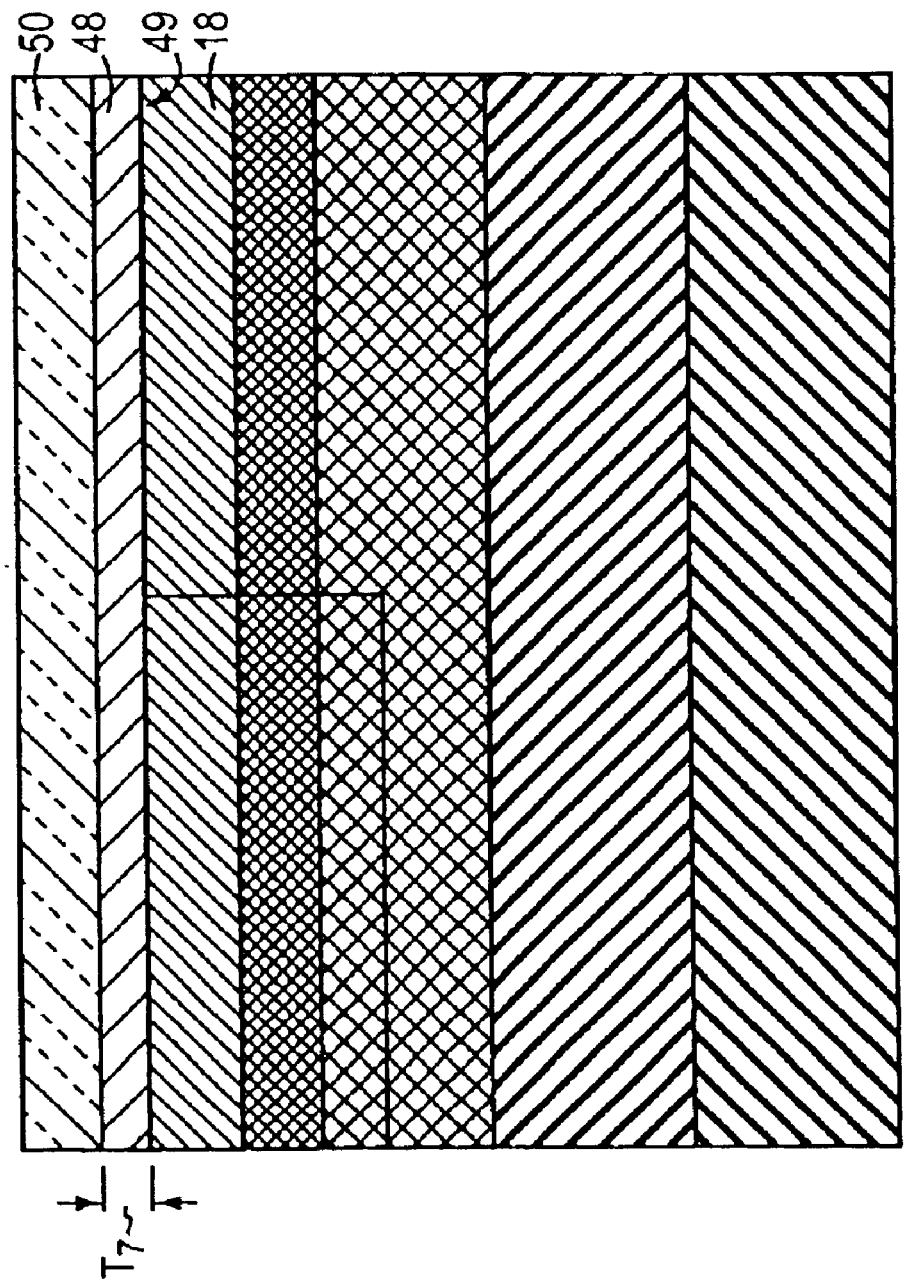

Referring to FIG. 6, a gate dielectric layer 48 is formed on a top surface 49 of tensile strained Si layer 18. Gate dielectric layer 48 is, for example, a gate oxide such as silicon dioxide (SiO$_2$) having a thickness $T_7$ of approximately 10–100 Å. A conducting layer 50 such as doped polysilicon, is deposited over gate dielectric layer 48.

Figure 7:
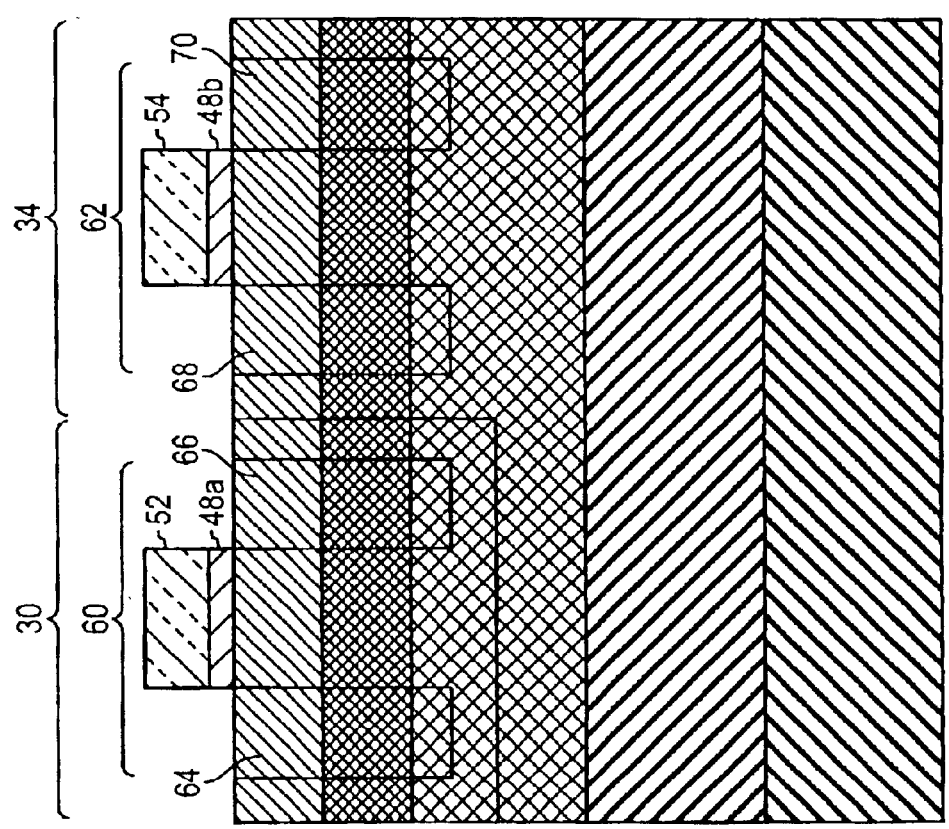

Referring to FIG. 6 and also to FIG. 7, conducting layer 50 is patterned by, for example, photolithography and etching, to define a first gate 52 in first region 30 and a second gate 54 in second region 34. First gate 52 is, for example, a gate for a PMOS transistor 60 and second gate 54 is, for example, a gate for an NMOS transistor 62. A first source 64 and a first drain 66 (defined for purposes of illustration, by the interior boundaries) are formed in first region 30, proximate first gate 52. First source 64 and first drain 66 can be formed by the implantation of p-type ions, such as boron. PMOS transistor 60 includes first source 64, first drain 66, first gate 52 and a first dielectric layer portion 48a. A second source 68 and a second drain 70 (defined for purposes of illustration, by the interior boundaries) are formed in second region 34, proximate second gate 54. Second source 68 and second drain 70 may be formed by the implantation of n-type ions, such as phosphorus. NMOS transistor 62 includes second source 68, second drain 70, second gate 54, and a second dielectric layer portion 48b.

In some embodiments, during operation of PMOS transistor 60, holes travel from first source 64 to first drain 66 through a channel including a portion of compressed $Si_{1-y}Ge_y$ layer 16, disposed under first gate 52. During operation of NMOS transistor 62, electrons travel from second source 68 to second drain 70 through a channel including a portion of tensile strained Si layer 18 disposed under second gate 54.

Figure 8:
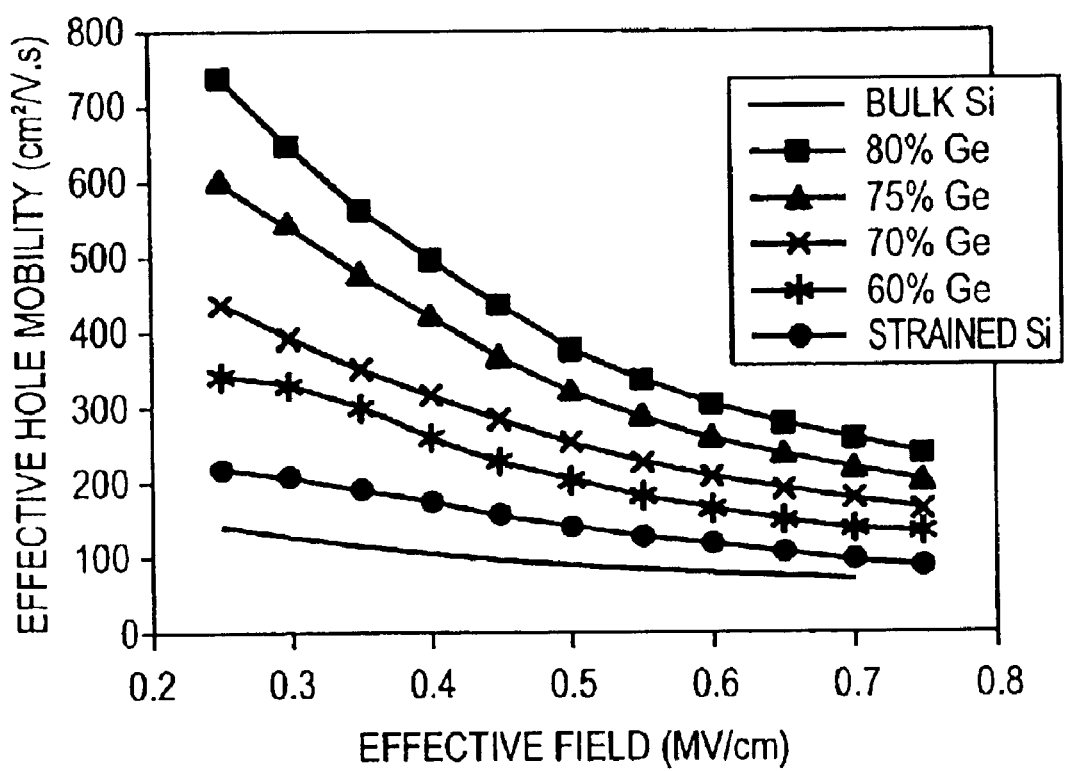
FIG. 8 is a plot of effective hole mobility vs. effective vertical field for dual channel heterostructure PMOSFETs under constant strain.

Referring to FIGS. 1 and 7 and also to FIG. 8, the performance enhancement provided by dual channel heterostructures may be quantified by correlating the variation of effective carrier mobility to the effective vertical field. The term "mobility" describes the velocity of carriers under an applied electric field and is directly proportional to the mean scattering time of carriers. The actual value of drift mobility in a MOSFET (hereafter referred to as "effective mobility") takes into account the change in scattering time with an electric field (hereafter referred to as "effective vertical field") experienced by carriers in an inversion layer. Effective vertical field takes into account various charges in the semiconductor. In particular, the semiconductor has a bulk depletion charge and an inversion layer charge. The bulk depletion charge is set by substrate doping and is independent of the applied gate voltage, while the inversion layer charge increases with the applied gate voltage. Thus, increased gate voltages lead to increased vertical fields, and the two may be viewed as equivalent. Increases in carrier mobility indicate an increase in switching speed in MOSFETs. Changes in mobility enhancements of carriers in dual channel heterostructures over bulk silicon with changing effective vertical field thus signify different performance enhancements.

In FIG. 8, effective hole mobilities versus effective vertical fields are plotted for dual channel-heterostructure PMOSFETs under constant strain. For all dual channel heterostructures in this plot, y−x=0.3. The compressed $Si_{1-y}Ge_y$ layer 16 composition (y) is indicated for each curve. In these embodiments, all compressed $Si_{1-y}Ge_y$ layer 16 and tensile strained Si layer 18 thicknesses ($T_3$ and $T_4$) are approximately 85 Å. For the sake of comparison, effective hole mobility in a strained Si PMOSFET on a 30% Ge virtual substrate, with a tensile strained Si layer 18 thickness of 150 Å is also given on this plot. All of these dual channel heterostructures display significant improvements in hole mobility over conventional strained Si PMOSFETs. Ge content x and y in compressed $Si_{1-y}Ge_y$ layer 16 and relaxed $Si_{1-x}Ge_x$ layer 14 may be selected to define hole as well as electron mobility in tensile stained Si layer 18 and compressed $Si_{1-y}Ge_y$ layer 16. Carrier mobility is a function of strain, and here, strain is defined by the difference in Ge content between compressed $Si_{1-y}Ge_y$ layer 16 and relaxed $Si_{1-x}Ge_x$ layer 14, i.e., the difference y−x. The Ge contents x and y may be selected to maximize an average carrier mobility in tensile strained Si layer 18 and compressed $Si_{1-y}Ge_y$ layer 16. In particular, an embodiment in which the heterostructure has an 80% Ge (i.e., y=0.8) channel on a 50% virtual substrate 15 (i.e., x=0.5) displays significant improvements in hole mobility over the entire field range tested. Furthermore, at low vertical fields, electron and hole mobility in this embodiment are within 25% of each other. As seen in FIG. 8, selection of proper compressed $Si_{1-y}Ge_y$ layer 16 composition provides performance improvement in PMOSFETs. Moreover, by using a dual channel configuration, one may achieve more symmetric carrier mobilities (reducing the ratio of electron to hole mobility to less than 2), and therefore more symmetric current drive, both of which are enhanced with respect to bulk Si.

Figure 9:
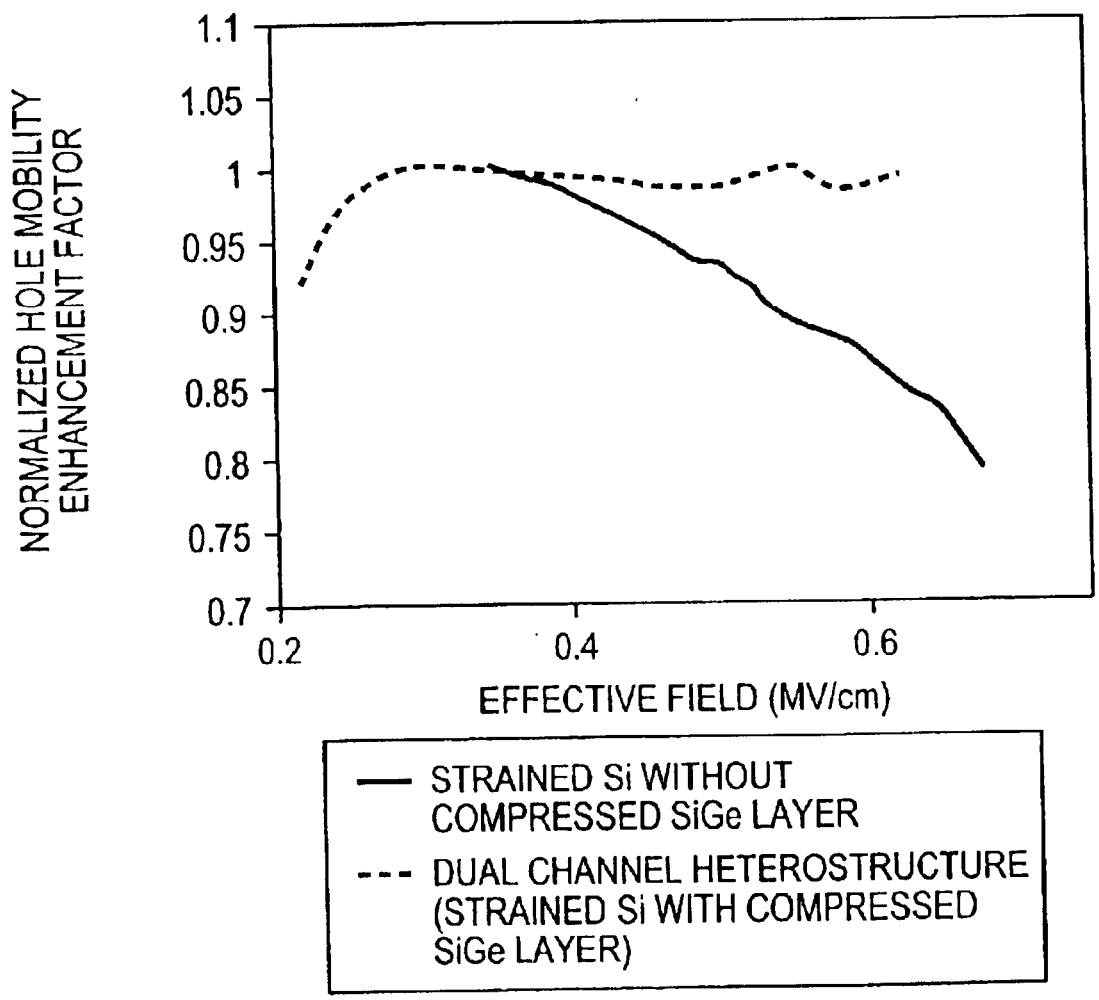
FIG. 9 is a plot of normalized hole mobility enhancement over bulk Si versus vertical field for strained silicon structures with and without a compressed SiGe layer.

Referring to FIGS. 1 and 7 as well as FIG. 9, hole mobility enhancements in PMOS structures including strained Si are compared to hole mobilities in PMOS structures formed in bulk Si, as a function of increasing vertical field. The strained Si devices include (i) a PMOS dual channel heterostructure, e.g., transistor 60 with tensile strained Si layer 18 and compressed $Si_{1-y}Ge_y$ layer 16 and (ii) a strained Si PMOS device, i.e., tensile strained Si layer 18 without compressed $Si_{1-y}Ge_y$ layer 16 but including relaxed $Si_{1-x}Ge_x$ layer 14. FIG. 9 illustrates the ratio of hole mobility enhancement at a particular vertical field to the maximum hole mobility enhancement attained for each type of heterostructure (i) and (ii). In other words, FIG. 9 compares the rate degradation of hole mobility enhancement factors in (i) dual channel heterostructure PMOS devices and (ii) strained Si PMOS devices. The data illustrates hole mobility enhancements for PMOS devices having compressed $Si_{1-y}Ge_y$ layer 16 with y=1 and relaxed $Si_{1-x}Ge_x$ layer 14 with x=0.7. This figure clearly illustrates that hole mobility enhancements may be maintained more readily in a dual channel heterostructure such as transistor 60. Further, referring also to FIG. 8, in dual channel heterostructures, not only are hole mobilities enhanced with respect to devices formed in substrates 10 with tensile strained Si layer 18 and without compressed $Si_{1-y}Ge_y$ layers 16, but also the dual channel heterostructure hole mobility enhancements degrade less with higher effective fields.

Figure 10:
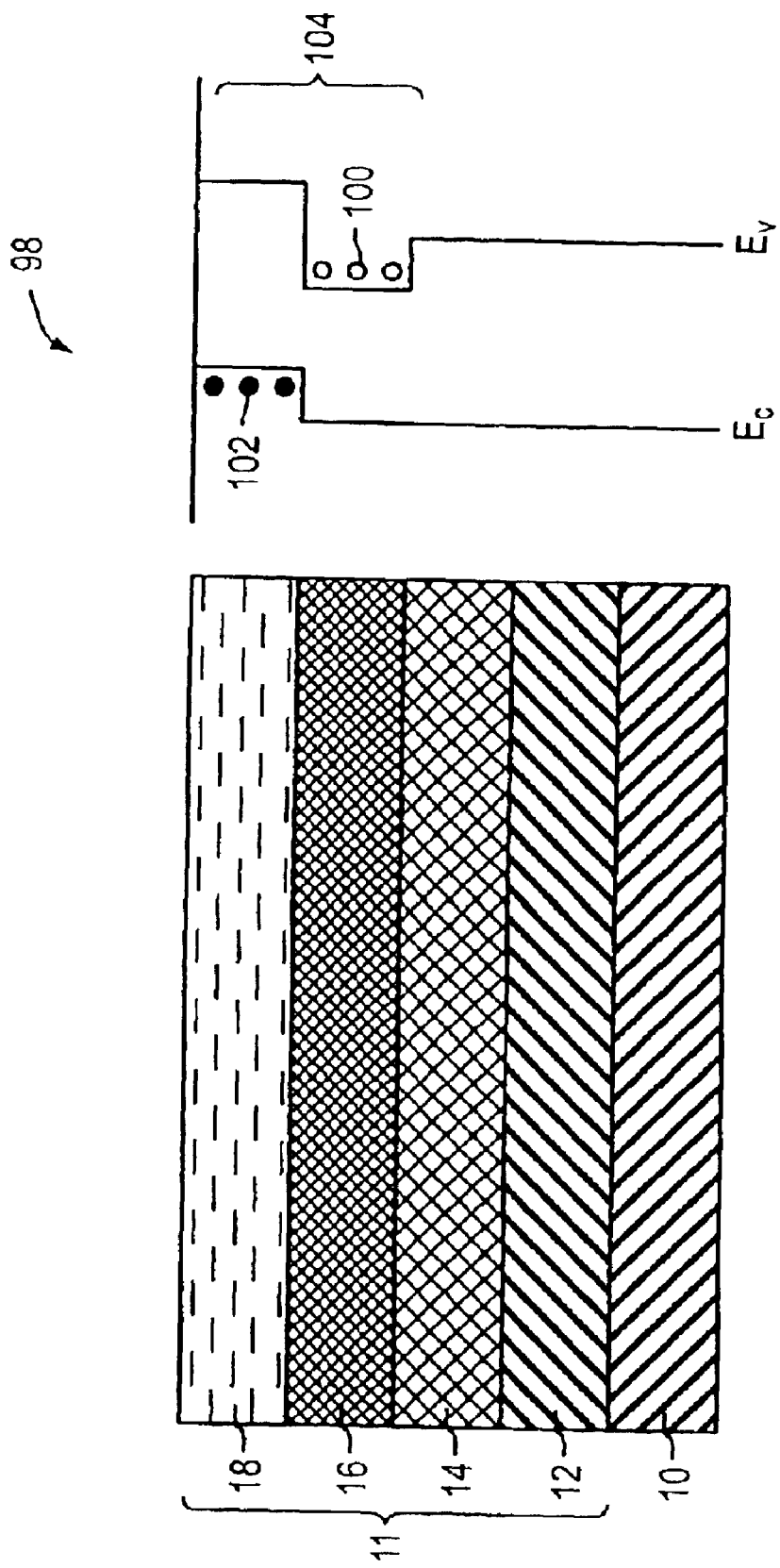
FIG. 10 illustrates the energy band for the semiconductor substrate shown in FIGS. 1–7.

Referring to FIG. 10, carriers have equilibrium distributions in substrate 10 with layers 11, i.e., graded SiGe layer 12, relaxed SiGe layer 14, compressed $Si_{1-y}Ge_y$ layer 16, and tensile strained Si layer 18. More specifically, referring to energy band structure 98 with conduction energy band $E_c$ and valence band $E_v$, a plurality of holes 100 (p-type carriers) is located in compressed $Si_{1-y}Ge_y$ layer 16 and a plurality of electrons 102 (n-type carriers) is located in tensile strained Si layer 18.

Generally, energy band structure 98 and associated valence band offsets 104 are applicable to any layer structure featuring compressively strained $Si_{1-y}Ge_y$ layer 16 and tensile strained Si layer 18. The strain in these layers 16, 18 provides the energy band offsets that serve as potential wells for the carriers. The magnitude of the valence offset between the layers, i.e., virtual substrate 15, compressed $Si_{1-y}Ge_y$ layer 16, and tensile strained Si layer 18, is determined by the differences in composition between these layers. This analysis assumes channel thicknesses are such that the wavefunctions of electrons and holes can be confined.

Figure 11:
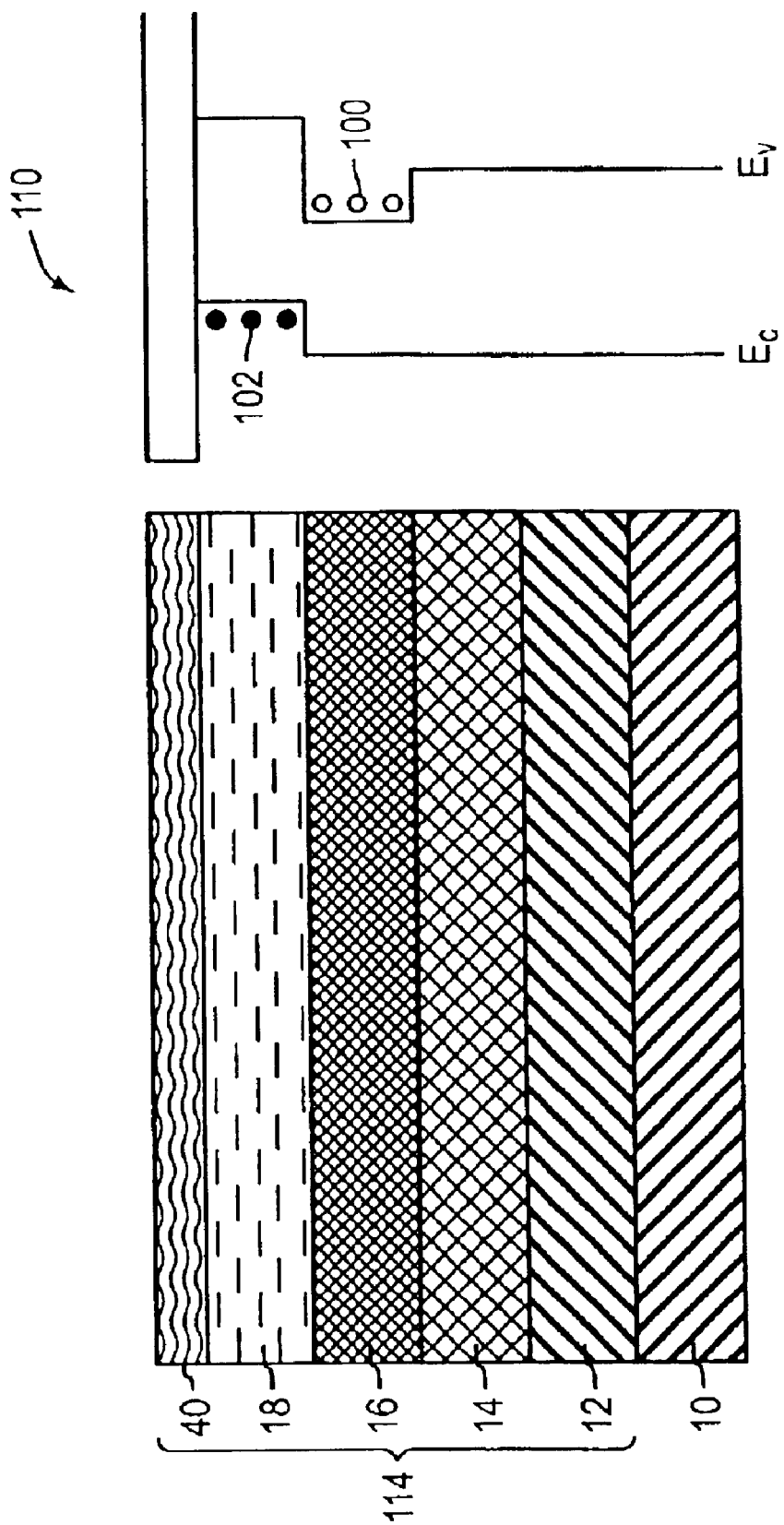
FIG. 11 illustrates the energy band for the semiconductor substrate of FIG. 10 capped by an oxide layer.

By applying a voltage through a gate dielectric, the underlying channel conductivity may be modulated and the distribution of holes in the semiconductor layer may be altered. Referring to FIG. 11, gate dielectric layer 40 is disposed over layers 11. Applying a voltage through gate dielectric layer 40 allows one to modulate hole 100 population distribution between compressed $Si_{1-y}Ge_y$ layer 16 and tensile strained Si layer 18 (see energy band 110) in, for example, PMOS transistor 60 (see FIGS. 7 and 12). The distribution of electrons 102 is not affected by the presence of compressed $Si_{1-y}Ge_y$ layer 16, and remains substantially the same as in strained-silicon NMOS devices.

Figure 12:
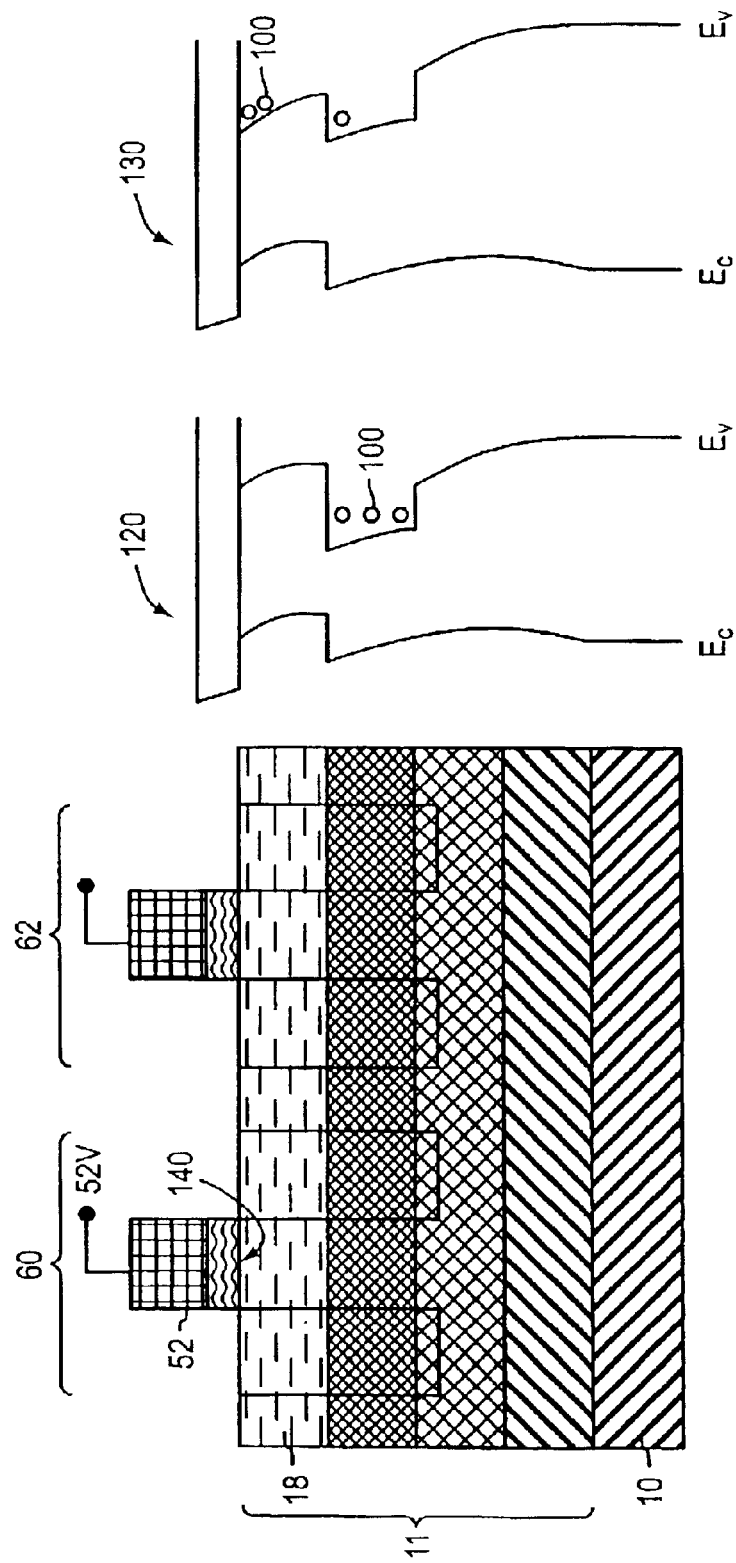
FIG. 12 illustrates energy bands for a PMOS transistor with low and high effective vertical fields.

Referring to FIG. 12, PMOS transistor 60 and NMOS transistor 62 are formed on layers 11 disposed over substrate 10, as discussed above with reference to FIGS. 1–7. Energy band 120 illustrates hole 100 population during low vertical field operation, e.g., an effective field of about 0.3 MV/cm, or, for example, a low voltage 52v applied to gate 52 of PMOS transistor 60. Low voltage 52v may be, for example, 100 mV above a threshold voltage of PMOS transistor 60 of, e.g., 300 mV. In this embodiment, holes 100 are confined to a buried strained SiGe channel, i.e., compressed $Si_{1-y}Ge_y$ layer 16. Energy band 130 illustrates hole 100 population during high vertical field operation, e.g., an effective field of about 0.8 MV/cm or, for example, a high voltage 52v of about 1.5 V is applied to gate 52 of PMOS transistor 60. In this embodiment, holes 100 populate both channels, i.e., tensile strained Si layer 18 and compressed $Si_{1-y}Ge_y$ layer 16. Having holes 100 in both tensile strained Si layer 18 and compressed $Si_{1-y}Ge_y$ layer 16 provides normal operation of digital transistor 60 at high voltage, i.e., high field. Population in both layers results in an average mobility determined by the mobility of holes in each layer and the distribution of holes between the layers. The optimization of the average mobility of carriers in compressed $Si_{1-y}Ge_y$ layer 16 and tensile strained Si layer 18 will result in operating conditions with high drain currents, thus enabling fast switching. Application of voltage 52v to gate 52 results in electron population in tensile strained Si layer 18 or in both tensile strained Si layer 18 and compressed $Si_{1-y}Ge_y$ layer 16.

In conventional strained Si PMOS transistors, i.e., devices formed on substrates without compressed $Si_{1-y}Ge_y$ layer 16, holes 100 are present in a tensile strained Si layer 18 during high field operation, but the hole wave function extends into the SiGe virtual substrate 15 because of the light out-of-plane effective mass of holes in strained Si. The virtual substrate has a lower hole mobility than strained silicon, and thus the mixture of layers populated by holes lowers overall hole mobility.

On the other hand, the presence of a compressed $Si_{1-y}Ge_y$ layer 16 in dual channel heterostructures, e.g., PMOS transistor 60, changes this hole distribution. Now band offsets confine holes and prevent their wavefunction from "leaking" into virtual substrate 15. Even though some holes 100 overcome the $Si_{1-y}Ge_y$/Si valence band offset and are pulled to a surface 140, hole wavefunctions now populate high mobility strained Si layer 18 and even higher mobility compressed $Si_{1-y}Ge_y$ layer 16. Thus, the compressed $Si_{1-y}Ge_y$ layer 16 allows the widely spread hole wavefunction to sample layers with higher mobilities, i.e., compressed $Si_{1-y}Ge_y$ layer 16 enhances hole confinement and boosts hole mobility.

Referring to FIG. 12 and again to FIGS. 1 and 10, changing channel thickness, i.e., changing thickness $T_4$ of tensile strained Si layer 18 and thickness $T_3$ of compressed $Si_{1-y}Ge_y$ layer 16, provides a method for engineering high field hole population. When tensile strained Si layer 18 is sufficiently thick, the majority of the hole wavefunction is pulled into tensile strained Si layer 18 as effective field increases, i.e., as band offset is overcome. In this case, the hole mobility is approximately equal to hole mobility in strained silicon layer 18. If tensile strained Si layer 18 is sufficiently thin, the majority of the hole wavefunction cannot sample tensile strained Si layer 18 regardless of vertical field. In this case, the hole mobility is approximately equal to hole mobility in compressed $Si_{1-y}Ge_y$ layer 16. The marked difference between low and high field operation is, therefore, blurred by using a thin Si surface channel. Thickness $T_4$ of tensile strained Si layer 18 and thickness $T_3$ of compressed $Si_{1-y}Ge_y$ layer 16 may be selected to define hole mobilities in tensile strained Si layer 18 and compressed layer 16. These thicknesses $T_3$ and $T_4$ may also be selected to maximize the average of the hole mobilities in tensile strained Si 18 and compressed $Si_{1-y}Ge_y$ layer 16.

A similar approach may be used to select thickness $T_4$ of tensile strained Si layer 18 and thickness $T_3$ of compressed $Si_{1-y}Ge_y$ layer 16 to define electron mobilities in the tensile strained Si layer 18 and the compressed $Si_{1-y}Ge_y$ layer 16. When tensile strain silicon layer 18 is sufficiently thick, a majority of the electron wavefunction is present in the tensile strained Si layer 18. When tensile strained Si layer 18 is sufficiently thin, the electron wavefunction cannot be confined within tensile strained Si layer 18 and the majority of the wavefunction is present in the compressed $Si_{1-y}Ge_y$ layer 16. Therefore, thicknesses $T_3$ and $T_4$ may be selected to define electron mobilities in tensile strained Si layer 18 and compressed $Si_{1-y}Ge_y$ layer 16. These thicknesses $T_3$ and $T_4$ may also be selected to maximize the average of the electron mobilities in tensile strained Si layer 18 and compressed $Si_{1-y}Ge_y$ layer 16.

Figure 13:
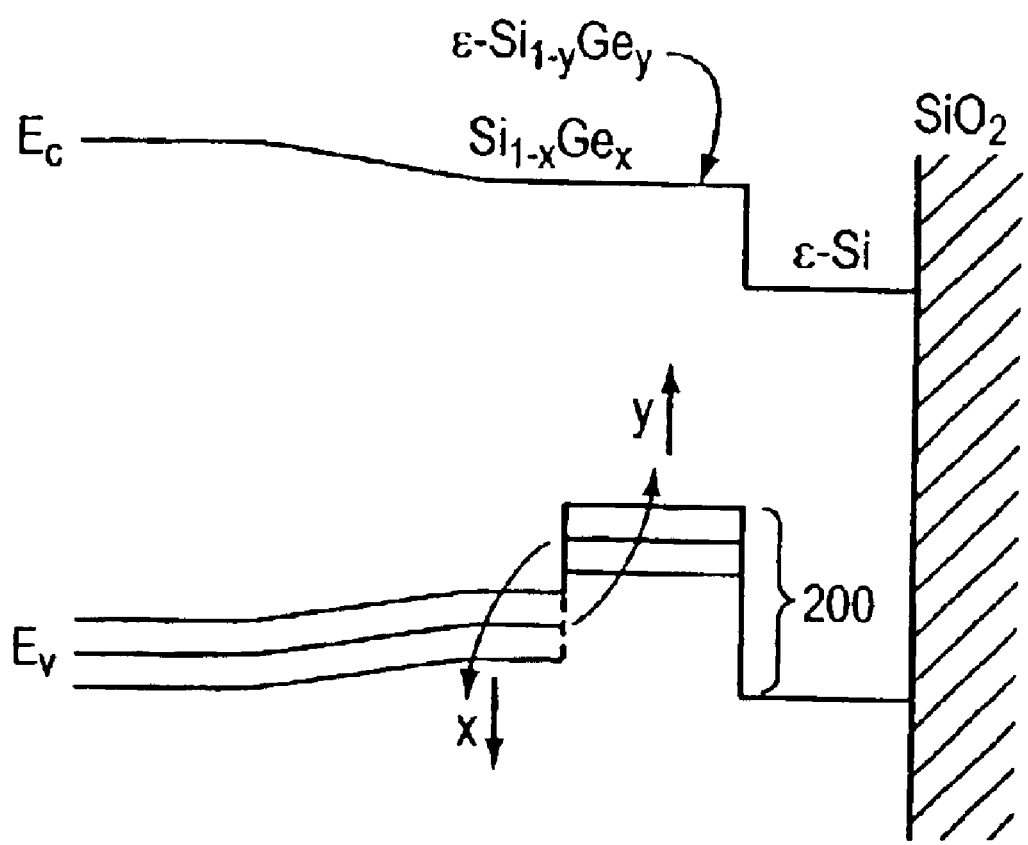
FIG. 13 illustrates energy bands for a PMOS transistor having varying Ge content in a compressed $Si_{1-y}Ge_y$ layer.

Referring to FIG. 13, changing Ge composition of compressed $Si_{1-y}Ge_y$ layer 16, i.e., changing y, changes the valence band offset 200 between the compressed $Si_{1-y}Ge_y$ layer 16 and tensile strained Si layer 18. This valence band offset 200 is the energy a hole must overcome to shift from compressed $Si_{1-y}Ge_y$ layer 16 to tensile strained Si layer 18. The valence band offset 200, therefore, is an indicator of whether holes populate compressed $Si_{1-y}Ge_y$ layer 16 or tensile strained Si layer 18. Applying a field to tensile strained Si layer 18 and compressed $Si_{1-y}Ge_y$ layer 16 shifts the valence band of each layer upward, with the $E_v$ of tensile strained Si layer 18 rising at a faster rate than the $E_v$ of compressed $Si_{1-y}Ge_y$ layer 16. Holes will occupy tensile strained Si layer 18 when its $E_v$ is higher than the $E_v$ of compressed $Si_{1-y}Ge_y$ layer 16, i.e., at the threshold point when device operation shifts between low-field and high-field operation. In some embodiments, substrate 10 with layers 11 (see, e.g., FIG. 1) may be a SiGe-on-insulator substrate, with a buried insulator layer separating include an oxide layer (not shown) disposed between substrate 10 and relaxed $Si_{1-x}Ge_x$ layer 14. A suitable substrate including layers 11 and oxide layer may be produced using a combination of wafer bonding and ultrahigh vacuum chemical vapor deposition, as described, for example, by Cheng, et al., PCT Application No. PCT/US01/41680, International Publication No. WO 02/15244, 2002, incorporated herein by reference, and Cheng et al., *Journal of Electronic Materials*, 30:12, 2001, incorporated herein by reference. Here, graded SiGe layer 12 is optional.

In alternative embodiments, the compressed layer 16 may include semiconductor materials such as GaAs, InGaAs, InP, InGaP and other alloys thereof. In some embodiments, the tensile strained layer 18 may include semiconductor materials such as GaAs, InGaAs, InP, InGaP and other alloys thereof.

In some embodiments, transistors, such as PMOSFETS, may be formed directly on compressed $Si_{1-y}Ge_y$ layer 16, in a portion of a substrate substantially free of tensile strained Si layer 18 over compressed $Si_{1-y}Ge_y$ layer 16.

The invention may be embodied in other specific forms without departing from the spirit of essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein.

What is claimed is:

1. A structure comprising:
   a tensile strained layer disposed over a substrate, the tensile strained layer having a first thickness, the first thickness being selected to define a first carrier mobility in the tensile strained layer; and
   a compressed layer disposed between the tensile strained layer and the substrate, the compressed layer having a second thickness, the second thickness being selected to define a second carrier mobility in the compressed layer,
   wherein the first and second carrier mobilities comprise electron mobilities, and the first and second thicknesses are selected to maximize an average electron mobility.

2. The structure of claim 1, wherein the tensile strained layer comprises Si.

3. The structure of claim 1, wherein the compressed layer comprises $Si_{1-y}Ge_y$.

4. The structure of claim 3 further comprising:
   a relaxed layer disposed between the tensile strained layer and the substrate, the relaxed layer including $Si_{1-x}Ge_x$ being less than y.

5. The structure of claim 4, wherein germanium contents y and x are selected to define the second carrier mobility in the compressed layer.

6. The structure of claim 4, wherein germanium contents y and x are selected to maximize an average carrier mobility.

7. The structure of claim 4 further comprising:
   a graded layer disposed over the substrate, the graded layer including SiGe.

8. The structure of claim 1 further comprising:
   an insulating layer disposed between the substrate and the compressed layer.

9. The structure of claim 8, wherein the insulating layer comprises silicon dioxide.

10. The structure of claim 1 further comprising:
    a transistor disposed on the tensile strained layer, the transistor including:
    (i) a gate dielectric portion disposed over a portion of the tensile strained layer;
    (ii) a gate disposed over the first gate dielectric; and
    (iii) a source and a drain disposed in a portion of the tensile strained layer and proximate the gate dielectric,
    wherein application of an operating voltage to the gate results in the population of the tensile strained layer and compressed layer by charge carriers.

11. The structure of claim 10, wherein the charge carriers comprise electrons.

12. The structure of claim 10, wherein the charge carriers comprise holes.

13. A structure comprising:
    a compressed semiconductor layer disposed over a substrate;
    a tensile strained layer disposed over at least a portion of the compressed layer; and
    a p-type metal-oxide-semiconductor (PMOS) transistor including:
    (i) a dielectric layer disposed over a portion of the tensile strained layer;
    (ii) a gate disposed over a portion of the dielectric layer, the gate comprising a first conducting layer; and
    (iii) a first source and a first drain disposed in a portion of the tensile strained layer and proximate the gate dielectric portion, the first source and first drain comprising p-type dopants,
    wherein the PMOS transistor has a first hole mobility enhancement, the first hole mobility enhancement decreasing at a slower rate as a function of increasing vertical field than a second hole mobility of a PMOS transistor formed on a second substrate including a strained silicon layer, the second substrate being substantially free of a compressed layer.

14. The structure of claim 13, wherein the slower rate of the first hole mobility enhancement decrease as a function of increasing vertical field is approximately zero.

15. A structure comprising:
   a compressed semiconductor layer disposed over a substrate;
   a tensile strained layer disposed over and contacting at least a first portion of the compressed layer;
   a p-type metal-oxide-semiconductor (PMOS) transistor including:
   (i) a first gate dielectric portion disposed over a second portion of the compressed layer,
   (ii) a first gate disposed over the first gate dielectric portion, the first gate comprising a first conducting layer,
   (iii) a first source and a first drain disposed in a region of the compressed semiconductor layer and proximate the first gate dielectric portion, the first source and first drain including p-type dopants; and
   an n-type metal-oxide-semiconductor (NMOS) transistor including:
   (i) a second gate dielectric portion disposed over a portion of the tensile strained layer,
   (ii) a second gate disposed over the second gate dielectric portion, the second gate comprising a second conducting layer,
   (iii) a second source and a second drain disposed in a region of the tensile strained layer and proximate the second gate dielectric portion, the second source and second drain including n-type dopants,
   wherein during operation of the PMOS transistor, holes travel from the first source to the first drain through a first channel comprising the second compressed layer portion disposed under the first gate and during operation of the NMOS transistor, electrons travel from the second source to the second drain through a second channel comprising the tensile layer portion disposed under the second gate.

16. The structure of claim 15, wherein the second portion of the compressed layer is substantially separate from the first portion, such that the first gate dielectric portion is in contact with the second portion of the compressed layer.

17. A structure comprising:
   a compressed semiconductor layer disposed over a substrate;
   a tensile strained layer disposed over at least a portion of the compressed layer;
   a p-type metal-oxide-semiconductor (PMOS) transistor including:
   (i) a first gate dielectric portion disposed over a first portion of the tensile strained layers,
   (ii) a first gate disposed over the first gate dielectric portion, the first gate comprising a first conducting layer,
   (iii) a first source and a first drain disposed in a region of the tensile strained semiconductor layer and proximate the first gate dielectric portion, the first source and first drain including p-type dopants; and
   an n-type metal-oxide-semiconductor (NMOS) transistor including:
   (i) a second gate dielectric portion disposed over a second portion of the tensile strained layer,
   (ii) a second gate disposed over the second gate dielectric portion, the second gate comprising a second conducting layer,
   (iii) a second source and a second drain disposed in a region of the tensile strained layer and proximate the second sate dielectric portion, the second source and second drain including n-type dopants,
   wherein during operation of the PMOS transistor, holes travel from the first source to the first drain through a first channel comprising the first tensile strained layer portion disposed under the first gate and during operation of the NMOS transistor, electrons travel from the second source to the second drain through a second channel comprising the second tensile layer portion disposed under the second gate.

18. A structure comprising:
   a compressed semiconductor layer disposed over a substrate;
   a tensile strained layer disposed over and contacting at least a first portion of the compressed layer;
   a p-type metal-oxide-semiconductor (PMOS) transistor including:
   (i) a first gate dielectric portion disposed over a second portion of the compressed layer,
   (ii) a first gate disposed over the first gate dielectric portion, the first gate comprising a first conducting layer,
   (iii) a first source and a first drain disposed in a region of the compressed semiconductor layer and proximate the first gate dielectric portion, the first source and first drain including p-type dopants; and
   an n-type metal-oxide-semiconductor (NMOS) transistor including:
   (i) a second gate dielectric portion disposed over a portion of the tensile strained layer,
   (ii) a second gate disposed over the second gate dielectric portion, the second gate comprising a second conducting layer,
   (iii) a second source and a second drain disposed in a region of the tensile strained layer and proximate the second gate dielectric portion, the second source and second drain including n-type dopants;
   wherein the PMOS transistor has a p-type carrier mobility enhancement with respect to a PMOS transistor formed in bulk silicon, and the NMOS transistor has an n-type carrier mobility enhancement with respect to an NMOS transistor formed in bulk silicon, with the enhancement of p-type carrier mobility being at least approximately equal to the enhancement of n-type carrier mobility.

19. The structure of claim 15, wherein the PMOS transistor has a p-type carrier mobility, NMOS transistor has an n-type carrier mobility, and a ratio of the n-type carrier mobility to the p-type carrier mobility is less than approximately 2.

20. A method for forming a structure, the method comprising:
   forming a compressed layer over a substrate, the compressed layer having a first thickness; and
   forming a tensile strained layer over the compressed layer, the tensile strained layer having a second thickness,
   wherein forming the compressed and tensile strained layers includes selecting the first and second thicknesses to define a first carrier mobility in the compressed layer and a second carrier mobility in the tensile strained layer, the first and second carrier mobilities comprising electron mobilities, and the first and second thicknesses selected to maximize an average electron mobility.

21. The method of claim 20, wherein the compressed layer comprises Ge.

22. The method of claim 20, wherein the tensile strained layer comprises Si.

23. A method for forming a structure, the method comprising:
   forming a compressed layer over a substrate;
   forming a tensile strained layer over at least a portion of the compressed layer; and
   forming a p-type metal-oxide-semiconductor (PMOS) transistor by:
      (i) forming a dielectric layer over a portion of the tensile strained layer;
      (ii) forming a gate over a portion of the dielectric layer, the gate comprising a conducting layer; and
      (iii) forming a source and a drain in a portion of the tensile strained layer and proximate the gate dielectric portion, the first source and first drain comprising p-type dopants,
   wherein forming the compressed and tensile strained layers and PMOS transistor includes selecting layer and transistor components such that applying an operating voltage to the gate populates a region of the tensile strained layer and a region of the compressed layer with a plurality of charge carriers.

24. A method for forming a structure, the method comprising:
   forming a relaxed semiconductor layer over a substrate;
   forming a compressed semiconductor layer over at least a portion of the relaxed semiconductor layer;
   forming a tensile strained layer over at least a portion of the compressed layer; and
   forming a p-type metal-oxide-semiconductor (PMOS) transistor by:
      (i) forming a dielectric layer over a portion of the tensile strained layer;
      (ii) forming a gate over a portion of the dielectric layer, the gate comprising a first conducting layer; and
      (iii) forming a first source and a first drain in a portion of the tensile strained layer and proximate the gate dielectric portion, the first source and first drain comprising p-type dopants
   wherein forming the relaxed, compressed, and tensile strained layers and the PMOS transistor includes selecting layer and transistor components such that the PMOS transistor has a first hole mobility enhancement, the first hole mobility enhancement decreasing at a slower rate as a function of increasing vertical field than a second hole mobility of a PMOS transistor formed on a second substrate including a strained silicon layer, the second substrate being substantially free of a compressed layer.

25. The method of claim 24, wherein the first hole mobility enhancement decrease as a function of increasing vertical field is approximately zero.

26. A method for forming a structure, the method comprising:
   forming a compressed semiconductor layer over a substrate;
   forming a tensile strained layer over and contacting at least a first portion of the compressed layer;
   forming a p-type metal-oxide-semiconductor (PMOS) transistor by:
      (i) forming a first gate dielectric portion over a second portion of the compressed layer,
      (ii) forming a first gate over the first gate dielectric portion, the first gate comprising a first conducting layer,
      (iii) forming a first source and a first drain in a region of the compressed semiconductor layer and proximate the first gate dielectric portion, the first source and first drain including p-type dopants; and
   forming an n-type metal-oxide-semiconductor (NMOS) transistor by:
      (i) forming a second gate dielectric portion over a portion of the tensile strained layer,
      (ii) forming a second gate over the second gate dielectric portion, the second gate comprising a second conducting layer,
      (iii) forming a second source and a second drain in a region of the tensile strained layer and proximate the second gate dielectric portion, the second source and second drain including n-type dopants,
   wherein during operation of the PMOS transistor, holes travel from the first source to the first drain through a first channel comprising the second compressed layer portion disposed under the first gate and during operation of the NMOS transistor, electrons travel from the second source to the second drain through a second channel comprising the tensile layer portion disposed under the second gate.

27. The structure of claim 13, further comprising:
   a relaxed layer disposed between the substrate and the compressed semiconductor layer.

28. The structure of claim 27, wherein the relaxed layer contacts at least a portion of the compressed semiconductor layer.

29. The structure of claim 27, wherein the relaxed layer induces strain in at least one of the compressed semiconductor layer and the tensile strained layer.

30. The claim 15, further comprising:
   a relaxed layer disposed between the substrate and the compressed semiconductor layer.

31. The structure of claim 30, wherein the relaxed layer contacts at least a portion of the compressed semiconductor layer.

32. The structure of claim 30, wherein the relaxed layer induces strain in at least one of the compressed semiconductor layer and the tensile strained layer.

33. The structure of claim 18, further comprising:
   a relaxed layer disposed between the substrate and the compressed semiconductor layer.

34. The structure of claim 33, wherein the relaxed layer contacts at least a portion of the compressed semiconductor layer.

35. The structure of claim 33, wherein the relaxed layer induces strain in at least one of the compressed semiconductor layer and the tensile strained layer.

36. The method of claim 23, further comprising:
   forming a relaxed layer over the substrate.

37. The method of claim 36, wherein the compressed semiconductor layer is formed in contact with at least a portion of the relaxed layer.

38. The method of claim 36, wherein the relaxed layer induces strain in at least one of the compressed semiconductor layer and the tensile strained layer.

39. The method of claim 24, wherein the compressed semiconductor layer is formed in contact with at least a portion of the relaxed layer.

40. The method of claim 39, wherein the relaxed layer induces strain in at least one of the compressed semiconductor layer and the tensile strained layer.

41. The method of claim 26, further comprising:
   forming a relaxed layer over the substrate.

42. The method of claim 41, wherein the compressed semiconductor layer is formed in contact with at least a portion of the relaxed layer.

43. The method of claim 41, wherein the relaxed layer induces strain in at least one of the compressed layer and the tensile strained layer.

44. The structure of claim 15, wherein the first channel is adjacent the first gate dielectric and the second channel is adjacent the second gate dielectric.

45. The structure of claim 17, wherein the first channel is proximate the first gate dielectric and the second channel is proximate the second gate dielectric.

46. A structure comprising:
- a tensile strained layer disposed over a substrate, the tensile strained layer having a first thickness, the first thickness being selected to define a first carrier mobility in the tensile strained layer; and
- a compressed layer disposed between the tensile strained layer and the substrate, the compressed layer having a second thickness, the second thickness being selected to define a second carrier mobility in the compressed layer, wherein the first and second carrier mobilities comprise hole mobilities, and the first and second thicknesses are selected to maximize an average hole mobility.

47. A method for forming a structure, the method comprising:
- forming a compressed layer over a substrate, the compressed layer having a first thickness; and
- forming a tensile strained layer over the compressed layer, the tensile strained layer having a second thickness,
- wherein forming the compressed and tensile strained layers includes selecting the first and second thicknesses to define a first carrier mobility in the compressed layer and a second carrier mobility in the tensile strained layer, the first and second carrier mobilities comprising hole mobilities, and the first and second thicknesses selected to maximize an average hole mobility.

* * * * *